(12) United States Patent
Dai et al.

(10) Patent No.: US 11,489,006 B2
(45) Date of Patent: Nov. 1, 2022

(54) DISPLAY PANEL, PREPARATION METHOD THEREOF AND DISPLAY DEVICE

(71) Applicant: Shanghai Tianma Micro-Electronics Co., Ltd., Shanghai (CN)

(72) Inventors: Wenjun Dai, Shanghai (CN); Liang Xing, Shanghai (CN); Tianyi Wu, Shanghai (CN); Yuan Ding, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 17/007,613

(22) Filed: Aug. 31, 2020

(65) Prior Publication Data
US 2021/0408103 A1 Dec. 30, 2021

(30) Foreign Application Priority Data
Jun. 30, 2020 (CN) .......................... 202010622467.5

(51) Int. Cl.
*H01L 27/15* (2006.01)
(52) U.S. Cl.
CPC .................................. *H01L 27/156* (2013.01)
(58) Field of Classification Search
CPC .............................. H01L 27/156; H01L 33/22
See application file for complete search history.

(56) References Cited

U.S. PATENT DOCUMENTS

| 2017/0179097 | A1* | 6/2017 | Zhang | H01L 33/0093 |
| 2019/0229170 | A1* | 7/2019 | Tsai | H01L 51/56 |
| 2019/0302917 | A1 | 10/2019 | Pan | |
| 2020/0083415 | A1* | 3/2020 | Kim | H01L 21/02 |
| 2021/0126045 | A1* | 4/2021 | Yeon | H01L 33/46 |
| 2021/0175278 | A1* | 6/2021 | Lo | H01L 33/42 |
| 2021/0265420 | A1* | 8/2021 | Itou | H01L 33/00 |

FOREIGN PATENT DOCUMENTS

| CN | 107085333 A | 8/2017 |
| CN | 109004078 A | 12/2018 |
| CN | 110190084 A | 8/2019 |
| CN | 110444560 A | 11/2019 |
| CN | 111223885 A | 6/2020 |

OTHER PUBLICATIONS

CN Office Action in relation to CN application 202010622467.5 dated Nov. 29, 2021.

* cited by examiner

*Primary Examiner* — Changhyun Yi
(74) *Attorney, Agent, or Firm* — von Briesen & Roper, s.c.

(57) ABSTRACT

Provided are a display panel, a preparation method thereof and a display device. The display panel includes a substrate; a driving circuit layer, where the driving circuit layer is disposed on a side of the substrate, and includes a plurality of driving circuits; and an LED element layer, where the LED element layer is disposed on a side of the driving circuit layer facing away from the substrate, and includes a plurality of micro-LED elements, where each of the plurality of micro-LED elements is electrically connected to a respective one of the plurality of driving circuits through a via hole.

20 Claims, 16 Drawing Sheets

US 11,489,006 B2

DISPLAY PANEL, PREPARATION METHOD THEREOF AND DISPLAY DEVICE

CROSS-REFERENCE TO RELATED APPLICATION

This application claims priority to Chinese Patent Application No. 202010622467.5 filed Jun. 30, 2020, the disclosure of which is incorporated herein by reference in its entirety.

TECHNICAL FIELD

Embodiments of the present disclosure relate to the field of display technologies and, in particular, to a display panel, a preparation method thereof and a display device.

BACKGROUND

A micro light emitting diode (micro LED) display, a display adopting micron-level LEDs, is widely studied due to its characteristics of independent pixel control, independent light emission control, high luminance, low power consumption, ultra-high resolution and high colorfulness. A key technology of the micro-LED display is a mass transfer technology.

The mass transfer technology in the related art is to transfer LED chip particles from an original substrate to a substrate with driving circuits by producing a transfer head. The transfer technology is complex in process, low in efficiency and high in cost.

SUMMARY

Embodiments of the present disclosure provide a display panel, a preparation method thereof and a display device, so as to solve the problem of complex process, low efficiency and high cost of mass transfer technology in the related art.

In a first aspect, an embodiment of the present disclosure provides a display panel. The display panel includes a substrate; a driving circuit layer, where the driving circuit layer is disposed on a side of the substrate, and includes a plurality of driving circuits; and an LED element layer, where the LED element layer is disposed on a side of the driving circuit layer facing away from the substrate, and includes a plurality of micro-LED elements which is electrically connected to the plurality of driving circuits in a one-to-one correspondence through via holes in the plurality of driving circuits.

In a second aspect, an embodiment of the present disclosure further provides a display device, including the display panel described in the first aspect.

In a third aspect, an embodiment of the present disclosure further provides a preparation method for a display panel, used for preparing the display panel described in the first aspect. The preparation method includes steps described below.

An LED element layer is formed on a first carrier substrate.

A driving circuit layer is formed on a side of the LED element layer facing away from the first carrier substrate, where the driving circuit layer includes a plurality of driving circuits.

A substrate is disposed on the driving circuit layer facing away from the LED element layer.

The first carrier substrate is peeled off.

The LED element layer is patterned to form a plurality of micro-LED elements, where the plurality of micro-LED elements are electrically connected to a respective one of the plurality of driving circuits through a via hole in the respective one of the plurality of driving circuits.

In the display panel, the preparation method thereof and the display device provided by the embodiments of the present disclosure, the LED element layer is disposed on the side of the driving circuit layer facing away from the substrate, and the driving circuits in the driving circuit layer are electrically connected to the micro-LED elements in the LED element layer through the via holes, so that a bonding layer is not needed and no transfer needs to be performed, thereby the alignment accuracy between the driving circuits and the micro-LED elements and the accuracy of the electrical connections between the driving circuits and the micro-LED elements are improved, and meanwhile the preparation efficiency and resolution of the display panel are improved.

DETAILED DESCRIPTION

To make the objects, technical solutions and advantages of the present disclosure clearer, the technical solutions of the present disclosure will be completely described below in conjunction with the specific embodiments and the drawings in the embodiments of the present disclosure. Apparently, the embodiments described herein are part, not all, of the embodiments of the present disclosure, and based on the embodiments of the present disclosure, all other embodiments obtained by those skilled in the art on the premise that no creative work is done are within the protection scope of the present disclosure.

In terms of the problem in the background, the embodiments of the present disclosure provide a display panel. The display panel includes a substrate; a driving circuit layer, where the driving circuit layer is disposed on a side of the substrate, and includes a plurality of driving circuits; and an LED element layer. The LED element layer is disposed on a side of the driving circuit layer facing away from the substrate, and includes a plurality of micro-LED elements, where each of the plurality of micro-LED elements is electrically connected to a respective one of the plurality of driving circuits through a via hole in the respective one of the plurality of driving circuits.

In the above technical solution, the LED element layer is disposed on the side of the driving circuit layer facing away from the substrate, and the driving circuits in the driving circuit layer are electrically connected to the micro-LED elements in the LED element layer through the via holes, so that a bonding layer is not needed and no transfer needs to be performed, thereby the alignment accuracy between the driving circuits and the micro-LED elements and the accuracy of the electrical connections between the driving circuits and the micro-LED elements are improved, and meanwhile the preparation efficiency and resolution of the display panel are improved.

The above is the core concept of the present disclosure, and technical solutions in the embodiments of the present disclosure will be described clearly and completely in conjunction with the drawings in the embodiments of the present disclosure. Based on the embodiments of the present disclosure, all other embodiments obtained by those skilled in the art on the premise that no creative work is done are within the protection scope of the present disclosure.

Figure 1:
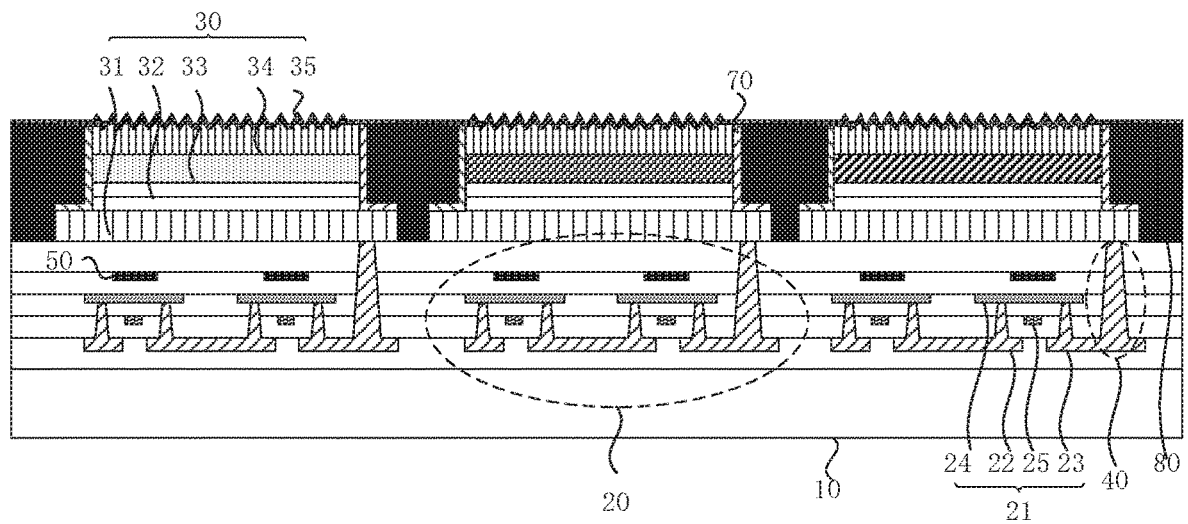
FIG. 1 is a structural diagram of a display panel according to an embodiment of the present disclosure.

FIG. 1 is a structural diagram of a display panel according to an embodiment of the present disclosure. As shown in FIG. 1, a display panel 100 according to the embodiment of the present disclosure includes a substrate 10; a driving circuit layer, where the driving circuit layer is disposed on a side of the substrate 10, and includes a plurality of driving circuits 20; and an LED element layer, where the LED element layer is disposed on a side of the driving circuit layer facing away from the substrate 10, and includes a plurality of micro-LED elements 30 where each of the plurality of micro-LED elements is electrically connected to a respective one of the plurality of driving circuits 20 through a via hole 40 in the respective one of the plurality of driving circuits 20.

Exemplarily, during the preparation of the display panel, the LED element layer may be firstly grown on a sapphire substrate during which sub-pixels are not segmented, and then the driving circuit layer is fabricated above the LED element layer, where the driving circuit layer includes the plurality of driving circuits. During the preparation of the driving circuit layer, the driving circuits in the driving circuit layer are electrically connected to the LED element layer separately through the via holes. And then, the LED element layer and the driving circuit layer are integrally arranged on the substrate 10, after which the sub-pixels are segmented to form the plurality of micro-LED elements 30. During the preparation of the driving circuit layer on the LED element layer, the driving circuits in the driving circuit layer have already been electrically connected to the LED element layer through the via holes, therefore, when the sub-pixels are subsequently segmented to form the plurality of micro-LED elements 30, the micro-LED elements 30 may be directly electrically connected to the driving circuits 20 in a one-to-one correspondence through the via holes 40 in the driving circuits 20, and thus no bonding layer is needed, which greatly improves the alignment accuracy between the driving circuits and light-emitting elements, and is beneficial for improving the accuracy of the electrical connections between the driving circuits 20 and the micro-LED elements 30. In addition, during the preparation of the display panel, the LED element layer and the driving circuit layer may be directly prepared on the sapphire substrate and attached with the substrate 10, and then the sub-pixels are segmented to form the plurality of micro-LED elements 30; therefore, the mass transfer of the micro-LED elements 30 is avoided, and the preparation efficiency of the display panel is improved. Compared with a transfer manner of the micro-LED elements 30 in the related art, the display panel 100 provided by the present disclosure does not need to reserve a certain region for the existence of a transfer error during the transfer, thereby greatly improving the resolution of the display panel 100. In addition, the driving circuit layer is fabricated above the LED element layer, and then the LED element layer and the driving circuit layer are integrally arranged on the substrate 10 and the sub-pixels are segmented, that is, before the driving circuit layer is formed, the LED element layer is disposed as an entire layer; therefore, the driving circuit layer is prepared with good flatness, avoiding a risk of disconnection between structures in the driving circuits in the driving circuit layer due to unevenness.

Optionally, the substrate 10 may be a rigid substrate or a flexible substrate, and a material of the substrate 10 is not limited in the embodiments of the present disclosure. In a case where the substrate 10 is the rigid substrate, the LED element layer and the driving circuit layer are directly integrally arranged on the rigid substrate and supported by the rigid substrate, and then the sub-pixels are segmented. In a case where the substrate 10 is the flexible substrate, after the flexible substrate is disposed on a side of the driving circuit layer facing away from the LED element layer, the LED element layer, the driving circuit layer and the flexible substrate are integrally transferred to the rigid substrate, where the rigid substrate is used to support the LED element layer, driver circuit layer and flexible substrate. Then, the sub-pixel is segmented, and the rigid substrate is peeled off at last.

Optionally, with continued reference to FIG. 1, each driving circuit 20 includes at least one thin film transistor 21, where the thin film transistor 21 includes a source electrode 22, a drain electrode 23, a gate electrode 25 and an active layer 24. The source electrode 22 and the drain electrode 23 of the thin film transistor 21 are disposed on a side of the substrate 10 facing towards the micro-LED elements 30, the gate electrode 25 of the thin film transistor 21 is disposed on a side of the source electrode 22 and the drain electrode 23 facing away from the substrate 10, and the active layer 24 of the thin film transistor 21 is disposed on a side of the gate electrode 25 facing away from the substrate 10.

In particular, a source electrode and a drain electrode of a thin film transistor in the related art are disposed on a side of an active layer facing away from a substrate, while the active layer 24 of the thin film transistor 21 in this embodiment is disposed on the side of the source electrode 22 and the drain electrode 23 facing away from the substrate 10. Considering that during the preparation of the display panel, the driving circuit layer is prepared after the LED element layer is prepared, if a relationship of the thin film transistor is the same as that in the related art, that is, the source electrode and the drain electrode of the thin film transistor are disposed on the side of the active layer facing away from the substrate, the source electrode 22 and the drain electrode 23 need to be prepared before the active layer 24 is prepared during the preparation of the driving circuit layer. Therefore, a metal layer where the source electrode 22 and the drain electrode 23 are located is patterned to form the source electrode 22 and the drain electrode 23, resulting in unevenness of a subsequent layer and thus affecting performance of the active layer 24. Therefore, in this embodiment, after the LED element layer is prepared, the active layer 24 of the thin film transistor 21 is firstly prepared, and then the source electrode 22 and the drain electrode 23 are prepared. In this case, the source electrode 22 and the drain electrode 23 of the thin film transistor 21 obtained are disposed on the side of the substrate 10 facing towards the micro-LED elements 30, and the active layer 24 is disposed on the side of the source electrode 22 and the drain electrode 23 facing away from the substrate 10, and thus the performance of the active layer 24 is not affected and reliability of the thin film transistor 21 is improved.

Optionally, the thin film transistor 21 may be a bottom-gate thin film transistor or a top-gate thin film transistor, which is not specifically limited in this embodiment. FIG. 1 merely illustrates that the thin film transistor 21 is the top-gate thin film transistor as an example, that is, the gate electrode 25 of the thin film transistor 21 is disposed between the source electrode 22 of the thin film transistor 21 and the active layer 24 of the thin film transistor 21.

Optionally, a material of the active layer 24 may include, for example, low temperature poly-silicon (LTPS). In this embodiment, since the LED element layer is prepared before the driving circuit layer is prepared during the preparation of the display panel, if a process for preparing the driving circuit layer requires high temperature, performance of the LED element layer will be affected. Therefore, in this embodiment, the material for making the active layer 24 is the low temperature poly-silicon, thereby avoiding an effect of a high-temperature process on the LED element layer. Optionally, the material of the active layer 24 is not limited to the low temperature poly-silicon, and may also include low temperature polycrystalline oxides (LTPOs). Those skilled in the art can understand that the material of the active layer 24 includes, but is not limited to, the above examples. Those skilled in the art can select the material of the active layer 24 according to product requirements, which is not specifically limited in the present disclosure.

Optionally, the display panel 100 further includes light-shielding layer 50 which is arranged in a one-to-one correspondence with the thin film transistors 21, where the light-shielding layer 50 is disposed on a side of the active layer 24 facing towards the micro-LED elements 30, and along a direction perpendicular to the substrate 10. A vertical projection of the light-shielding layer 50 on the plane where the substrate 10 is located covers a vertical projection of a channel region of the active layer 24 on the plane where the substrate 10 is located. The light-shielding layer 50 is configured to block light from the micro-LED element 30 to avoid an effect on a channel of the active layer 24, and thus the problem of photo-generated carriers generated by the channel of the active layer 24 affecting switching characteristics of the thin film transistor 21 is avoided, and the reliability of the thin film transistor 21 is improved.

To conclude, in the display panel provided by the embodiment of the present disclosure, the LED element layer is disposed on the side of the driving circuit layer facing away from the substrate, and the driving circuits in the driving circuit layer are electrically connected to the micro-LED elements in the LED element layer through the via holes, so that a bonding layer is not needed and no transfer needs to be performed, thereby the alignment accuracy between the driving circuits and the micro-LED elements and the accuracy of the electrical connections between the driving circuits and the micro-LED elements are improved, and meanwhile the preparation efficiency and resolution of the display panel are improved.

Figure 2:
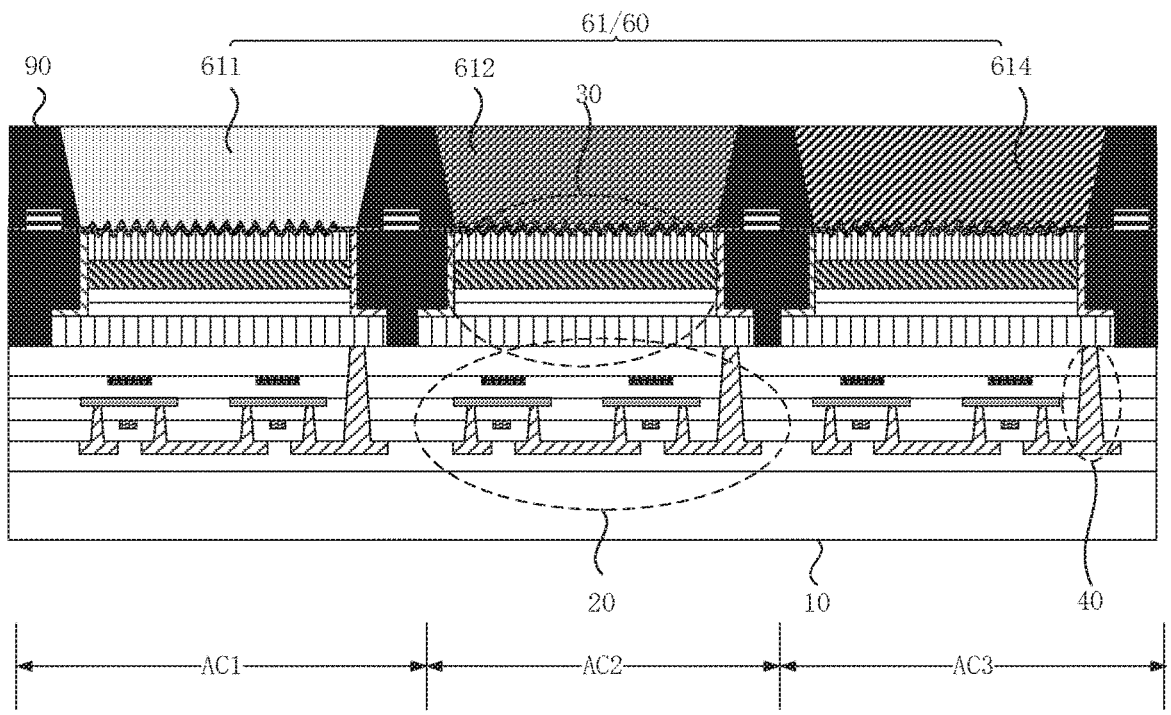
FIG. 2 is a structural diagram of another display panel according to an embodiment of the present disclosure.

Optionally, FIG. 2 is a structural diagram of another display panel according to an embodiment of the present disclosure. As shown in FIG. 2, the plurality of micro-LED elements 30 emit a same color of light; and a color film layer

60 is disposed on a side of the plurality of micro-LED elements 30 facing away from the substrate 10.

In particular, during the preparation of the LED element layer, each film in the LED element layer is prepared as an entire film, that is, each film structure in the LED element layer is prepared with a same material, which simplifies process steps. However, the plurality of micro-LED elements 30 subsequently formed emit the same color of light, and therefore, the color film layer 60 is disposed on the side of the plurality of micro-LED elements 30 facing away from the substrate 10 to achieve a color display of the display panel 100.

Optionally, with continued reference to FIG. 1, along a direction away from the substrate 10, the micro-LED element 30 includes a single-electrode micro-LED element; where the single-electrode micro-LED element includes a first electrode 31, a second-type semiconductor 32, a light-emitting layer 33, a first-type semiconductor 34 and a second electrode 35 which are arranged in sequence; where a first-type semiconductor 34 is a P-type semiconductor, and a second-type semiconductor 32 is an N-type semiconductor; or the second-type semiconductor 34 is a P-type semiconductor, and the first-type semiconductor 32 is an N-type semiconductor.

Figure 3:
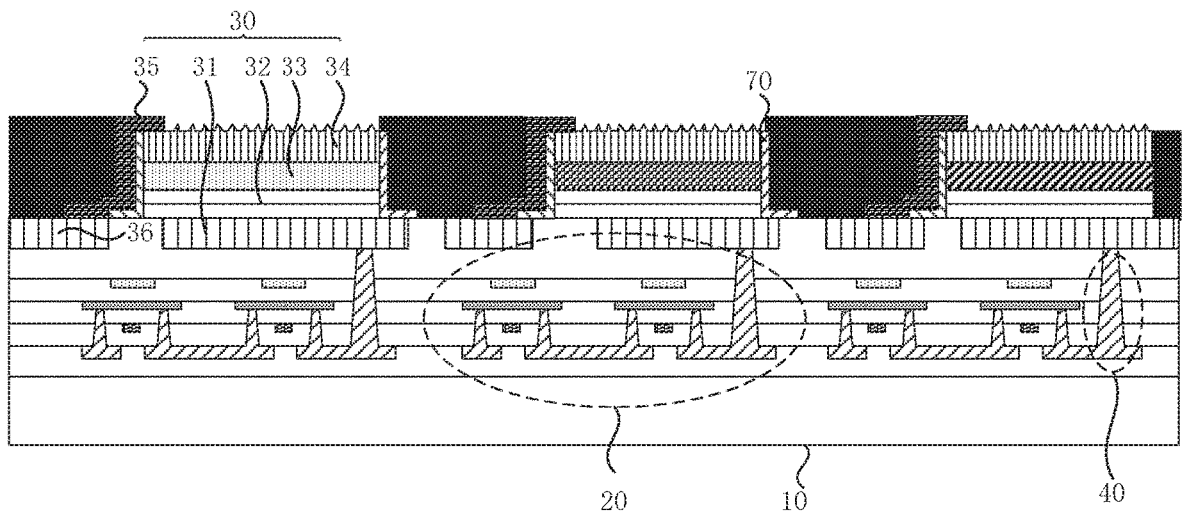
FIG. 3 is a structural diagram of another display panel according to an embodiment of the present disclosure.

Optionally, FIG. 3 is a structural diagram of another display panel according to an embodiment of the present disclosure. As shown in FIG. 3, the micro-LED element 30 includes a double-electrode micro-LED element; where the double-electrode micro-LED element includes the first electrode 31, the second electrode 35, a second electrode connection pad 36, the second-type semiconductor 32, the light-emitting layer 33 and the first-type semiconductor 34; where the first electrode 31 and the second electrode connection pad 36 are disposed in a same layer; the second-type semiconductor layer 32 is disposed between a film where the first electrode 31 is located and the light-emitting layer 33; the first-type semiconductor 34 is disposed on a side of the light-emitting layer 33 facing away from the substrate 10; and an end of the second electrode 35 is electrically connected to the first-type semiconductor layer 34, and the other end of the second electrode 35 is electrically connected to the second electrode connection pad 36. The first-type semiconductor 34 is the P-type semiconductor, and the second-type semiconductor 32 is the N-type semiconductor; or the second-type semiconductor 32 is the P-type semiconductor, and the first-type semiconductor 34 is the N-type semiconductor.

The micro-LED element 30 may include the single-electrode micro-LED element or the double-electrode micro-LED element, which can be selected by those skilled in the art according to practical situations and is not specifically limited in this embodiment. Meanwhile, materials of the micro-LED element 30 is not specifically limited in this embodiment, that is, materials of the second-type semiconductor 32, the light-emitting layer 33 and the first-type semiconductor 34 are not limited in this embodiment. For example, the materials of the second-type semiconductor 32 may be gallium nitride or gallium arsenide, the materials of the first-type semiconductor 34 may be gallium nitride or gallium arsenide, and the light-emitting layer 33 may be a multi-quantum-well light-emitting layer or the like.

In a case where the micro-LED element 30 includes the double-electrode micro-LED element, for example, a cathode signal may be provided for the second electrode 35 through the second electrode connection pad 36.

Optionally, with continued reference to FIG. 1, since the signals acquired by the second electrodes 35 of the plurality of micro-LED elements 30 are the same, in a case where the micro-LED element 30 includes the single-electrode micro-LED element, the second electrodes 35 of the plurality of micro-LED elements 30 may be arranged as an entire layer, and thus the process of preparation is simplified.

Optionally, with continued reference to FIG. 1 and FIG. 3, a surface of the first-type semiconductor 34 facing away from the substrate 10 is a rough and bumpy surface.

In particular, the surface of the first-type semiconductor 34 facing away from the substrate 10 is configured as the rough and bumpy surface, so that light-emitting efficiency of the micro-LED element 30 can be improved, and the problem of total reflection of the light emitted by the micro-LED element 30 can be avoided, which will affect the light yield.

In particular, with continued reference to FIG. 1 and FIG. 3, a vertical projection of the driving circuit 20 on the plane where the substrate 10 is located is located within a vertical projection of the first electrode 31 on the plane where the substrate 10 is located.

In particular, along a direction parallel to the substrate 10, a width of the first electrode 31 is greater than a width of the driving circuit 20. In this way, the driving circuit 20 is protected by the first electrode 31, thereby reducing an effect of light emitted by the micro-LED element 30 corresponding to an adjacent driving circuit 20 on this driving circuit 20, and improving stability of the driving circuit 20.

Optionally, with continued reference to FIG. 1 and FIG. 3, an insulating layer 70 is disposed on a sidewall of the micro-LED element 30. The insulating layer 70 is provided to prevent the second-type semiconductor 32 and the first-type semiconductor 34 from a current leakage through the sidewall, where the current leakage can affect the performance of the micro-LED element 30.

Optionally, with continued reference to FIG. 1, a first wall structure 80 is disposed between adjacent micro-LED elements 30.

The first wall structure 80 is made of a light-shielding material. The light-shielding material may include, for example, materials such as a black matrix. A specific material of the first wall structure 80 is not limited in this embodiment. In this embodiment, the first wall structure 80 is provided to prevent unnecessary light leakage and prevent crosstalk between light emitted by adjacent micro-LED elements 30, thereby improving a display effect of the display panel 100.

Optionally, with continued reference to FIG. 2, the color film layer 60 includes a plurality of sub-color film structures 61; where a second wall structure 90 is disposed between adjacent sub-color film structures 61 and disposed at a gap between adjacent micro-LED elements 30.

The second wall structure 90 is made of the light-shielding material. The light-shielding material may include, for example, the materials such as the black matrix. A specific material of the second wall structure 90 is not limited in this embodiment. In this embodiment, the second wall structure 90 is provided to prevent the crosstalk between light emitted by adjacent micro-LED elements 30, thereby improving the display effect of the display panel 100.

Figure 4:
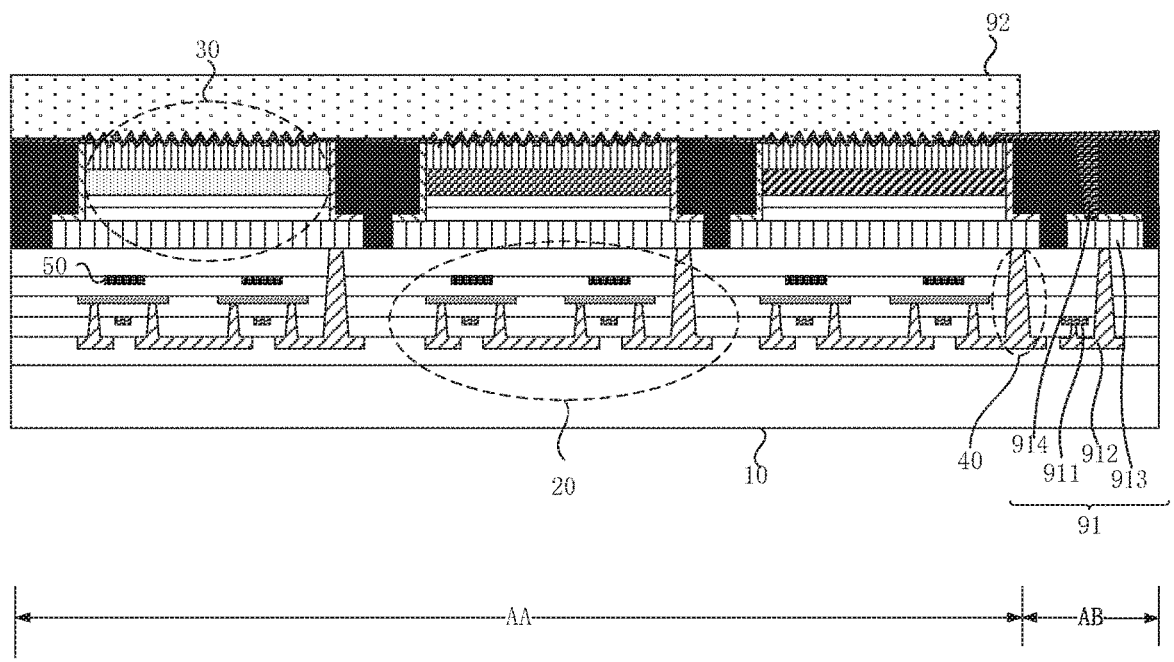
FIG. 4 is a structural diagram of another display panel according to an embodiment of the present disclosure.

Optionally, FIG. 4 is a structural diagram of another display panel according to an embodiment of the present disclosure. As shown in FIG. 4, the display panel 100 includes a display region AA and a non-display region AB surrounding the display region AA; where the non-display region AB of the display panel 100 is provided with a plurality of bonding terminals 91 which are electrically connected to the LED element layer and the driving circuit layer. The plurality of bonding terminals 91, the driving circuit layer and the LED element layer are all disposed on a same side of the substrate 10. Alternatively, FIG. 5 is a structural diagram of another display panel according to an embodiment of the present disclosure, and as shown in FIG. 5, the plurality of bonding terminals 91 are disposed on a side of the substrate 10 facing away from the driving circuit layer.

In particular, the bonding terminals 91 may be configured to bond driving chips so that the driving chips can provide corresponding signals to the driving circuits 20 through the bonding terminals 91; or the bonding terminals 91 may be configured to bond a flexible printed circuit board, where the flexible printed circuit board are provided with the driving chips, so that the driving chips can provide the corresponding signals to the driving circuits 20 through lines on the flexible circuit board and the bonding terminals 91.

Optionally, in a case where the bonding terminals 91, the driving circuit layer and the LED element layer are all disposed on the same side of the substrate 10, the bonding terminal 91 may include, for example, a first conductive structure 911, a second conductive structure 912, a third conductive structure 913 and the fourth conductive structure 914, where the first conductive structure 911 and the gate electrode of the driving circuit 20 are arranged in a same layer, the second conductive structure 912 and the source electrode and the drain electrode of the driving circuit 20 are arranged in a same layer, the third conductive structure 913 and the first electrode of the micro-LED element 30 are arranged in a same layer, and the fourth conductive structure 914 and the second electrode of the micro-LED element 30 are arranged in a same layer. Advantages of such arrangements are that the structure is simple, no additional process is needed, process procedures are reduced, manufacturing costs of the display panel 100 are reduced, and the preparation efficiency of the display panel 100 is improved. In a case where the bonding terminals 91 are disposed on the side of the substrate 10 facing away from the driving circuit layer, in addition to the conductive structures in the above solution, a fifth conductive structure 915 is further included. The fifth conductive structure 915 is disposed on the side of the substrate 10 facing away from the driving circuits 20. The bonding terminals 91 are disposed on the side of the substrate 10 facing away from the driving circuit layer, which can reduce a frame of the display panel 100, and thus narrow frame of the display panel 100 is achieved.

Figure 5:
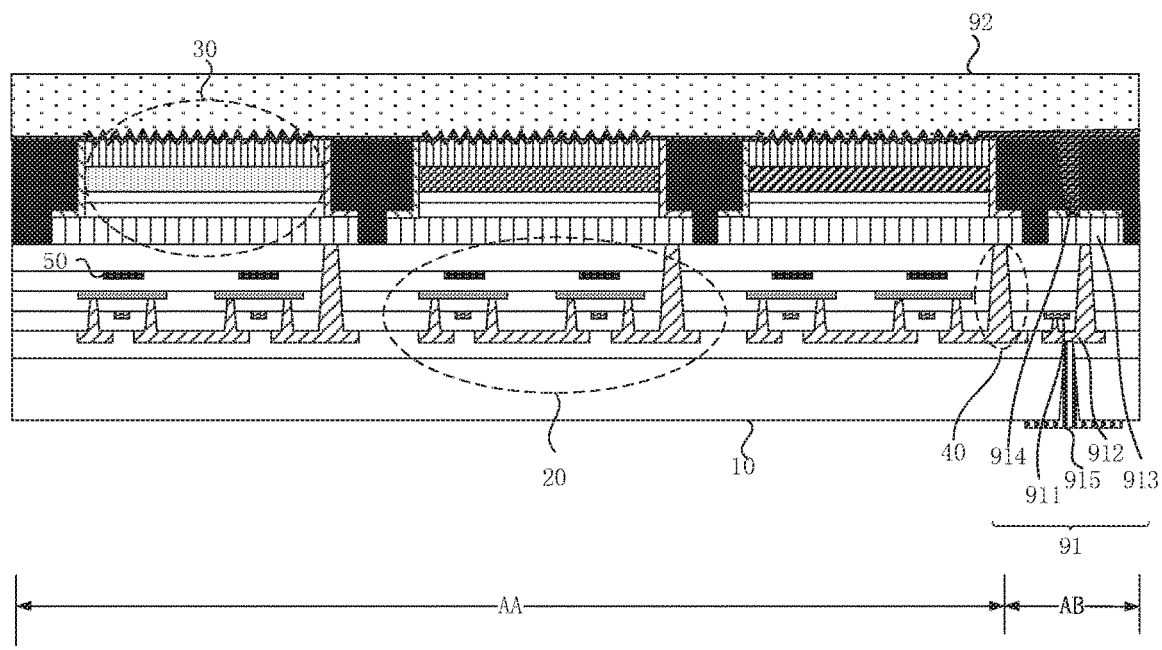
FIG. 5 is a structural diagram of another display panel according to an embodiment of the present disclosure.
Figure 6:
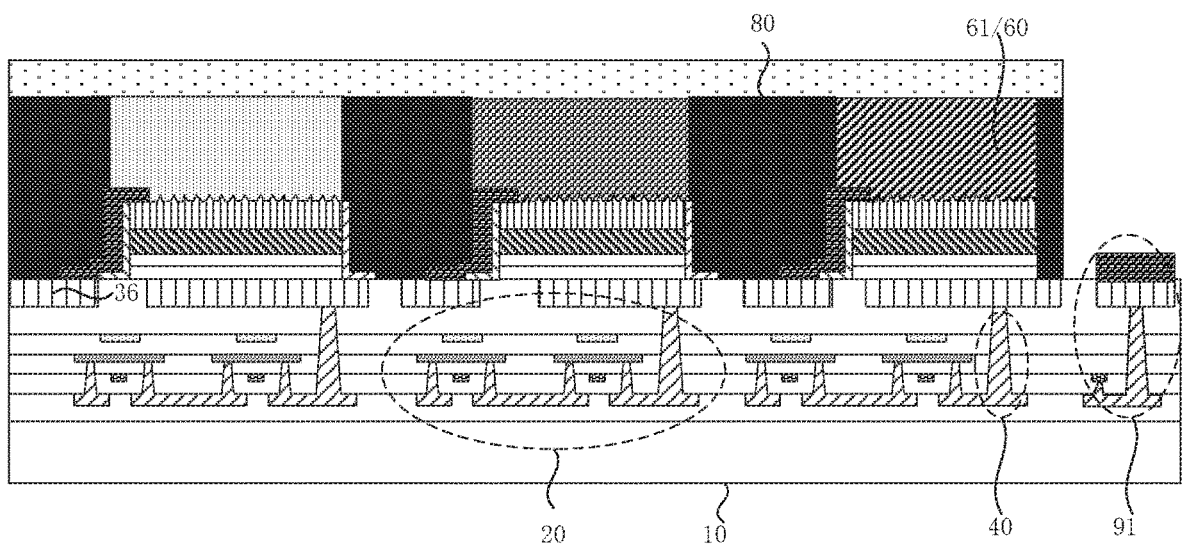
FIG. 6 is a structural diagram of another display panel according to an embodiment of the present disclosure.
Figure 7:
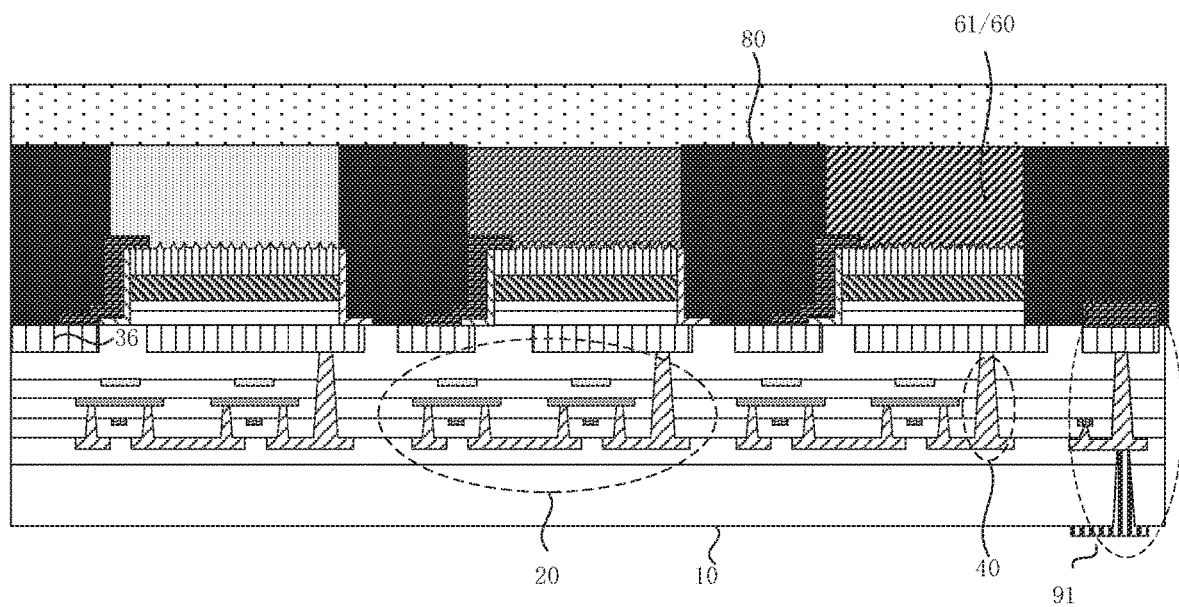
FIG. 7 is a structural diagram of another display panel according to an embodiment of the present disclosure.

It is to be noted that FIG. 4 and FIG. 5 merely illustrate that the micro-LED element 30 in the display panel 100 is the single-electrode micro-LED element. In other optional embodiments, the micro-LED element 30 may also be the double-electrode micro-LED element. For example, referring to FIG. 6, in a case where the micro-LED element 30 is the double-electrode micro-LED element 30, the bonding terminals 91, the driving circuit layer and the LED element layer are all disposed on the same side of the substrate 10. Alternatively, referring to FIG. 7, the bonding terminals 91 are disposed on the side of the substrate 10 facing away from the driving circuit layer. The conductive structures of the bonding terminal 91 are arranged in the same layer as structures in the display panel.

Based on this solution, optionally, with continued reference to FIG. 4, in a case where the bonding terminals 91, the driving circuit layer and the LED element layer are all disposed on the same side of the substrate 10, the display panel 100 further includes a protective layer 92, where the protective layer 92 is disposed on a side of the micro-LED elements 30 facing away from the substrate 10. The display panel 100 is encapsulated and protected by the protective layer 92, where the bonding terminals 91 are exposed out of the protective layer 92. Optionally, a material of the protective layer 92 may include, for example, polyimide, glass or the like.

Optionally, with continued reference to FIG. 5, in a case where the bonding terminals 91 are disposed on the side of the substrate 10 facing away from the driving circuit layer, the display panel 100 further includes the protective layer 92, where the protective layer 92 is disposed on the side of the micro-LED elements 30 facing away from the substrate 10. The display panel 100 is encapsulated and protected by the protective layer 92. Since the bonding terminal 91 is electrically connected to the driving chip or the flexible circuit board through the fifth conductive structure 915, the protective layer 92 not only is disposed in the display region AA but also may extend to the non-display region AB. Optionally, the material of the protective layer 92 may include, for example, polyimide, glass or the like.

Figure 8:
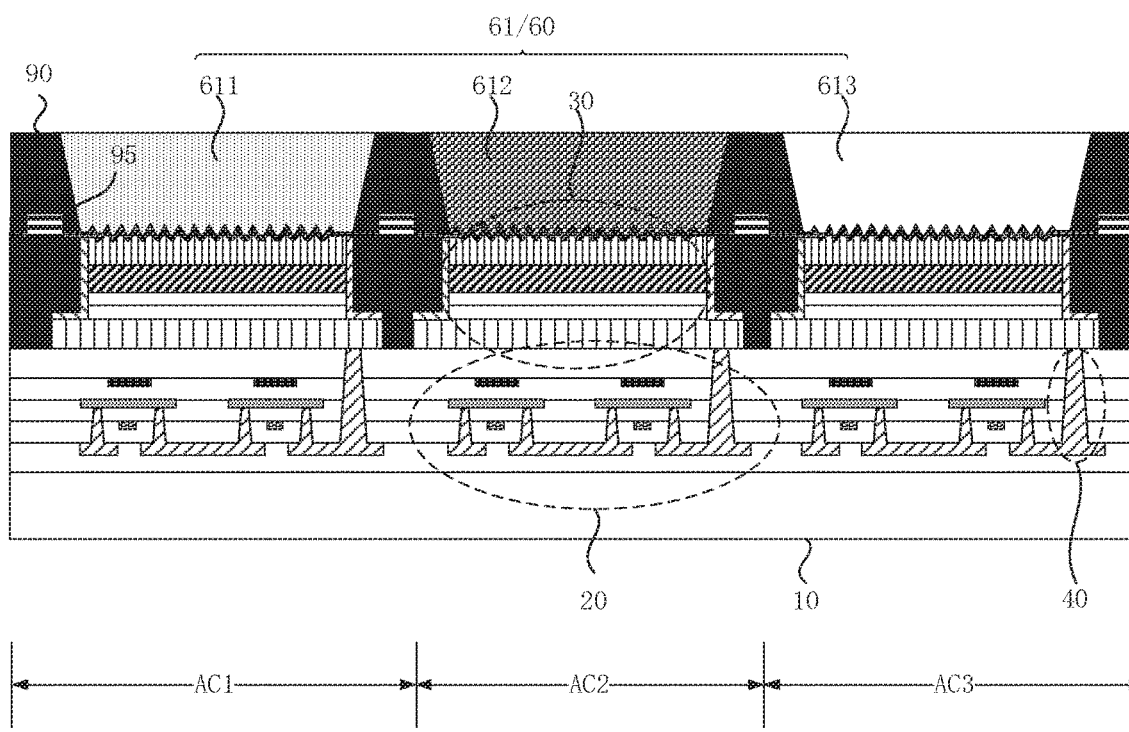
FIG. 8 is a structural diagram of another display panel according to an embodiment of the present disclosure.

Optionally, FIG. 8 is a structural diagram of another display panel according to an embodiment of the present disclosure. As shown in FIG. 8, the display panel 100 includes a plurality of sub-pixel regions AC; where the each of the plurality of micro-LED elements corresponds to a respective one of the plurality of sub-pixel regions and emits blue light; the plurality of sub-pixel regions includes a first sub-pixel region AC1, a second sub-pixel region AC2 and a third sub-pixel region AC3; and each of the sub-color film structures 61 in the color film layer 60 includes a red sub-color film structure 611, a green sub-color film structure 612 and a transparent sub-color film structure 613; where the red sub-color film structure 611 is disposed in the first sub-pixel region AC1, the green sub-color film structure 612 is disposed in the second sub-pixel region AC2, and the transparent sub-color film structure 613 is disposed in the third sub-pixel region AC3; and the red sub-color film structure 611 is configured to convert a light beam emitted by the micro-LED element 30 into a red light beam, and the green sub-color film structure 612 is configured to convert the light beam emitted by the micro-LED element 30 into a green light beam. In this way, the color display of the display panel 100 is achieved. Optionally, the red sub-color film structure 611 may include, for example, a color resist layer, a quantum dot color conversion layer, an attached quantum dot color conversion film or the like. The green sub-color film structure 612 may include, for example, the color resist layer, the quantum dot color conversion layer, the attached quantum dot color conversion film or the like. The transparent sub-color film structure 613 may be, for example, polyimide or the like.

Optionally, with continued reference to FIG. 2, the display panel 100 includes a plurality of sub-pixel regions AC; where the each of the plurality of micro-LED elements corresponds to a respective one of the plurality of sub-pixel regions and emits white light. The plurality of sub-pixel regions AC includes a first sub-pixel region AC1, a second sub-pixel region AC2 and a third sub-pixel region AC3; and each of the sub-color film structures 61 in the color film layer 60 includes a red sub-color film structure 611, a green sub-color film structure 612 and a blue sub-color film structure 614; where the red sub-color film structure 611 is disposed in the first sub-pixel region AC1, the green sub-color film structure 612 is disposed in the second sub-pixel region AC2, and the blue sub-color film structure 614 is disposed in the third sub-pixel region AC3; and the red sub-color film structure 611 is configured to convert the light beam emitted by the micro-LED element 30 into the red light beam, the green sub-color film structure 612 is configured to convert the light beam emitted by the micro-LED element 30 into the green light beam, and the blue sub-color film structure 614 is configured to convert the light beam emitted by the micro-LED element 30 into a blue light beam. In this way, the color display of the display panel 100 is achieved. Optionally, the red sub-color film structure 611 may include, for example, a color resist layer, a quantum dot color conversion layer, an attached quantum dot color conversion film or the like. The green sub-color film structure 612 may include, for example, the color resist layer, the quantum dot color conversion layer, the attached quantum dot color conversion film or the like. The blue sub-color film structure 614 may include, for example, the color resist layer, the quantum dot color conversion layer, the attached quantum dot color conversion film or the like. Optionally, light emitted by the plurality of micro-LED elements may also be ultraviolet light.

Optionally, with continued reference to FIG. 8, the display panel 100 further includes a metal block 95, where the metal block 95 is disposed on the side of the micro-LED elements 30 facing away from the substrate 10, a vertical projection of the metal block on a plane where the substrate 10 is located is located between vertical projections of adjacent micro-LED elements 30 on a plane where the substrate is located, and the metal block 95 is in direct contact with the second electrode. The metal block 95 can reduce resistance of the second electrode of the micro-LED element 30 without blocking the light from the micro-LED element 30.

Based on the concept described above, an embodiment of the present disclosure further provides a display device. The display device includes the display panel described in any embodiment of the present disclosure. Therefore, the display device provided by the embodiment of the present disclosure has the corresponding beneficial effects of the display panel provided by the embodiments of the present disclosure, which is not repeated here. Exemplarily, the display device may be a mobile phone, a computer, a smart wearable device (for example, a smart watch), an onboard display device, and other electronic devices, which is not limited in the embodiment of the present disclosure.

Figure 9:
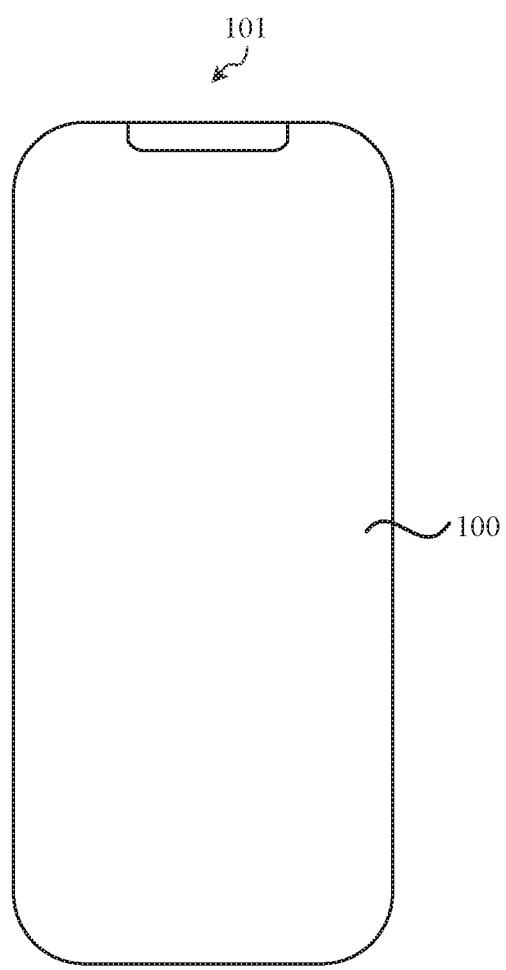
FIG. 9 is a structural diagram of a display device according to an embodiment of the present disclosure.

Exemplarily, FIG. 9 is a structural diagram of a display device according to an embodiment of the present disclosure. As shown in FIG. 9, the display device 101 includes the display panel 100 in the embodiments described above.

Figure 10:
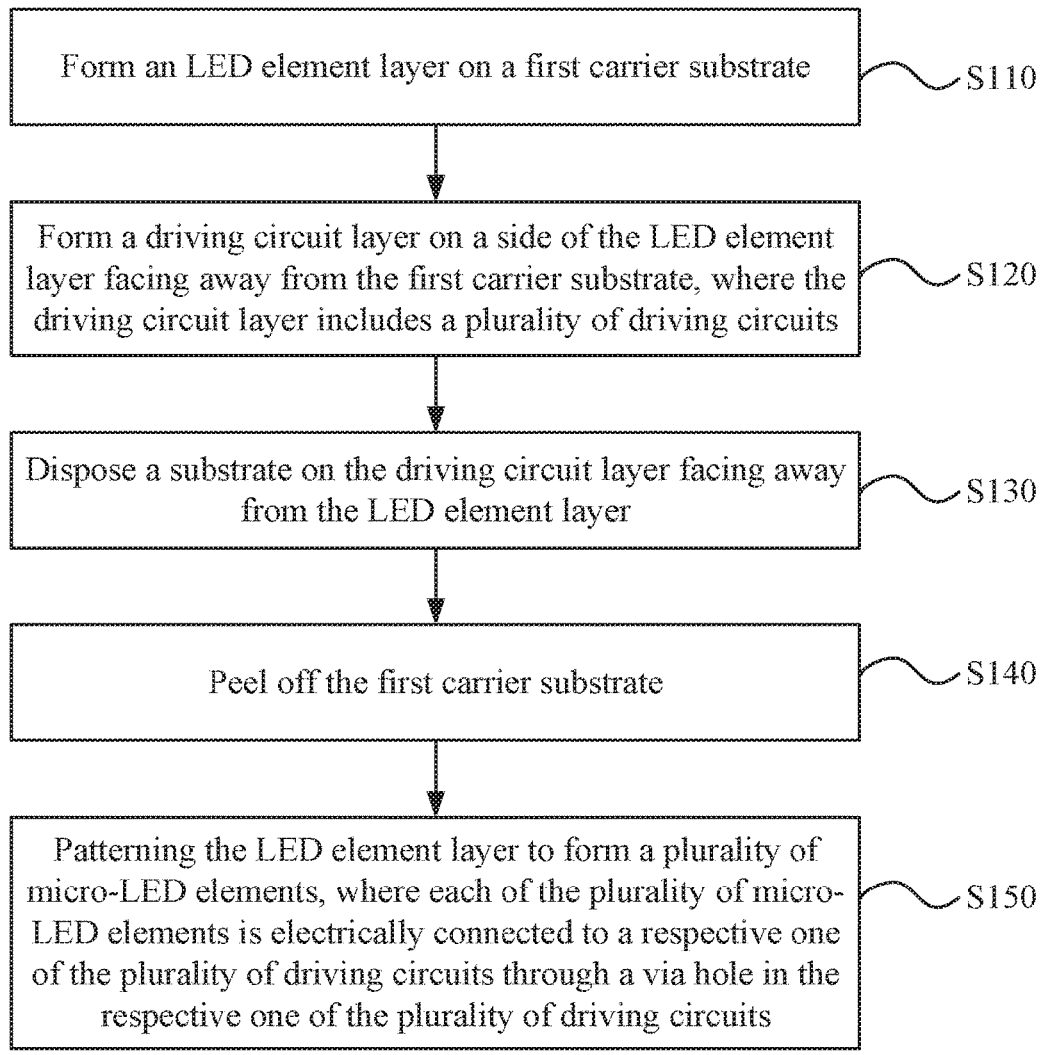
FIG. 10 is a flowchart of a preparation method for a display panel according to an embodiment of the present disclosure.

Based on the concept described above, an embodiment of the present disclosure further provides a preparation method for a display panel, which is used for preparing the display panel according to any one of the embodiments described above. FIG. 10 is a flowchart of a preparation method for a display panel according to an embodiment of the present disclosure. As shown in FIG. 10, the preparation specifically includes steps described below.

In S110, an LED element layer is formed on a first carrier substrate.

Figure 11:
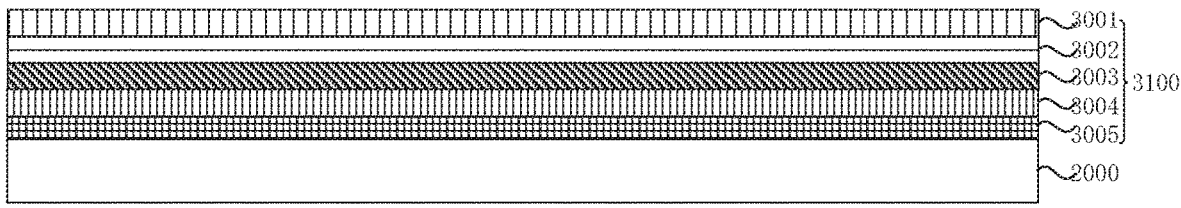
FIG. 11 is a structural diagram after a formed an LED element layer is formed according to an embodiment of the present disclosure.

FIG. 11 is a structural diagram after an LED element layer is formed according to an embodiment of the present disclosure. Referring to FIG. 11, the first carrier substrate 2000 may include, for example, a sapphire substrate. The LED element layer 3100 is formed on the first carrier substrate 2000.

Optionally, the step in which the LED element layer is formed on the first carrier substrate includes a step described below.

With continued reference to FIG. 11, a first-type semiconductor layer 3004, a light-emitting layer 3003, a second-type semiconductor layer 3002 and a conductive layer 3001 are formed in sequence on the first carrier substrate 2000; where the first-type semiconductor layer 3004 is a P-type semiconductor, and the second-type semiconductor layer 3002 is an N-type semiconductor; or the second-type semiconductor layer 3002 is the P-type semiconductor, and the first-type semiconductor layer 3004 is the N-type semiconductor.

Materials of the second-type semiconductor 3002 may include, for example, gallium nitride or gallium arsenide. Materials of the first-type semiconductor 3004 may include, for example, gallium nitride or gallium arsenide. The light-emitting layer 3003 may include, for example, a multi-quantum-well light-emitting layer or the like. Materials of the conductive layer 3001 may include, for example, indium tin oxide or metal. For example, the conductive layer 3001 may be patterned to form first electrodes.

It is to be noted that when the light-emitting layer 3003 is formed, it can be disposed as an entire layer, which simplifies process steps. That is, after micro-LED elements are formed, the micro-LED elements emit a same color of light. In this case, a color film layer needs to be disposed on a side of the LED element layer 3100 facing away from the substrate, and a solution for disposing the color film layer is described in detail in a subsequent embodiment and is not be repeated here. The micro-LED elements may also be prepared separately, that is, when the light-emitting layer 3003 is formed, sub-pixel regions is made of different materials, that is, the formed micro-LED elements emit different colors of light (not shown in the figure).

Optionally, before the first-type semiconductor layer 3004 is formed, at least one buffer layer 3005 may be grown on the first carrier substrate 2000. A material of the buffer layer 3005 may be, for example, microcrystalline gallium nitride, and a lattice defect density in the first-type semiconductor layer 3004 is reduced by the buffer layer 3005.

In S120, a driving circuit layer is formed on a side of the LED element layer facing away from the first carrier substrate, where the driving circuit layer includes a plurality of driving circuits.

Figure 12:
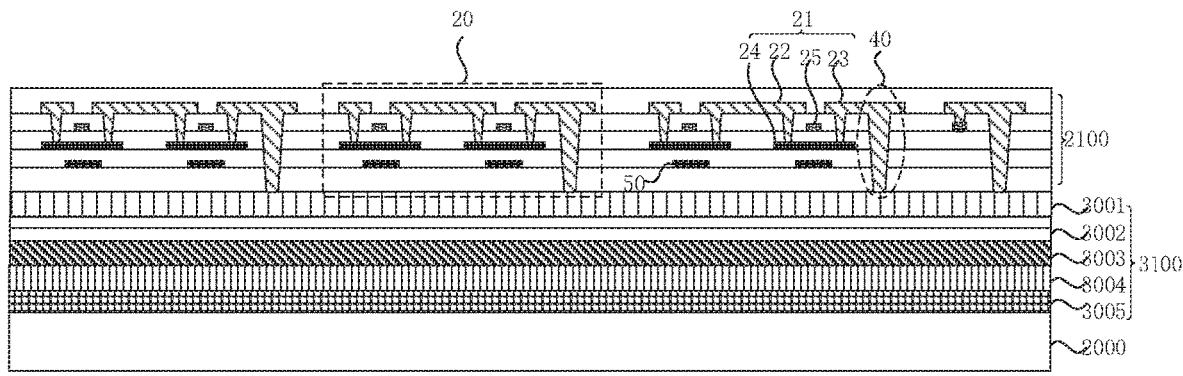
FIG. 12 is a structural diagram after a driving circuit layer is formed according to an embodiment of the present disclosure.

In the related art, after an LED element layer is grown, the LED element layer is segmented to form micro LEDs, then a die of the micro LEDs is separated from the sapphire substrate through a laser lift-off technology, and then the die of the micro LEDs is sucked off from the sapphire substrate and attached to a preset position of a receiving substrate by a transfer head. FIG. 12 is a structural diagram after a driving circuit layer is formed according to an embodiment of the present disclosure. Referring to FIG. 12, in this embodiment, after the LED element layer 3100 is formed, the LED element layer 3100 does not need to be segmented or subjected to other processes, while the driving circuit layer 2100 is directly formed on the LED element layer 3100.

Optionally, the driving circuit layer 2100 includes the plurality of driving circuits 20, each driving circuit includes at least one thin film transistor 21, and the thin film transistor 21 includes a source electrode 22, a drain electrode 23, a gate electrode 25 and an active layer 24; where the source electrode 22 and the drain electrode 23 of the thin film transistor 21 are disposed on a side of a substrate 10 facing towards the micro-LED elements 30, the active layer 24 is disposed on a side of the source electrode 22 and the drain electrode 23 facing away from the substrate 10, and the gate electrode 25 is disposed between a film where the active layer 24 is located and a film where the drain electrode 23 is located. The drain electrode 23 is electrically connected to the conductive layer 3001 in the LED element layer 3100 through a via hole 40.

Optionally, forming the driving circuit layer 2100 may specifically include: firstly forming the active layer 24 on a side of the LED element layer 3100 facing away from the first carrier substrate 2000. In this case, there is no patterned film before the active layer 24 is formed, thereby avoiding the problem that the patterned film results in film unevenness to affect performance of the active layer 24. Optionally, a material of the active layer 24 includes low temperature poly-silicon (LTPS). Considering that during the preparation of the display panel, the LED element layer 3100 is prepared before the driving circuit layer 2100 is prepared, if a process for preparing the driving circuit layer 2100 requires high temperature, performance of the LED element layer 3100 will be affected. Therefore, in this embodiment, the active layer 24 is made of the low temperature poly-silicon, thereby avoiding an effect of a high-temperature process on the LED element layer. The material of the active layer 24 is not limited to the low temperature poly-silicon. Optionally, the material of the active layer 24 may also include low temperature polycrystalline oxides (LTPOs). Those skilled in the art can understand that the material of the active layer 24 includes, but is not limited to, the above examples. Those skilled in the art can select the material of the active layer 24 according to product requirements, which is not specifically limited in the present disclosure. After the active layer 24 is prepared, a first metal layer is formed on a side of the active layer 24 facing away from the first carrier substrate 2000 and patterned to form the gate electrode 25 of the thin film transistor 21. It is understandable that before each metal layer is formed, an insulating layer needs to be formed, that is, the insulating layer is used for the insulation between adjacent metal layers. After the gate electrode 25 is formed, the insulating layer is punched to form via holes 40 to expose the first electrode layer 3001, and then a second metal layer is formed on a side of the first metal layer facing away from the first carrier substrate 2000 and patterned to form the source electrode 22 and the drain electrode 23 of the thin film transistor 21. In this case, electrical connections between the driving circuits 20 and the LED element layer 3100 can be achieved without a bonding technology. In this way, after the substrate is disposed on the driving circuit layer 2100 facing away from the LED element layer 3100, the source electrode 22 and the drain electrode 23 of the formed thin film transistor 21 are disposed on the side of the substrate 10 facing towards the LED element layer 3100, and the active layer 24 is disposed on the side of the source electrode 22 and the drain electrode 23 facing away from the substrate 10.

It should be noted that the thin film transistor 21 may be a bottom-gate thin film transistor or a top-gate thin film transistor, which is not specifically limited in this embodiment. FIG. 10 merely illustrates that the thin film transistor 21 is the top-gate thin film transistor as an example, that is, the gate electrode 25 is disposed between the source electrode 22 and the active layer 24.

In S130, the substrate is disposed on the driving circuit layer facing away from the LED element layer.

Figure 13:
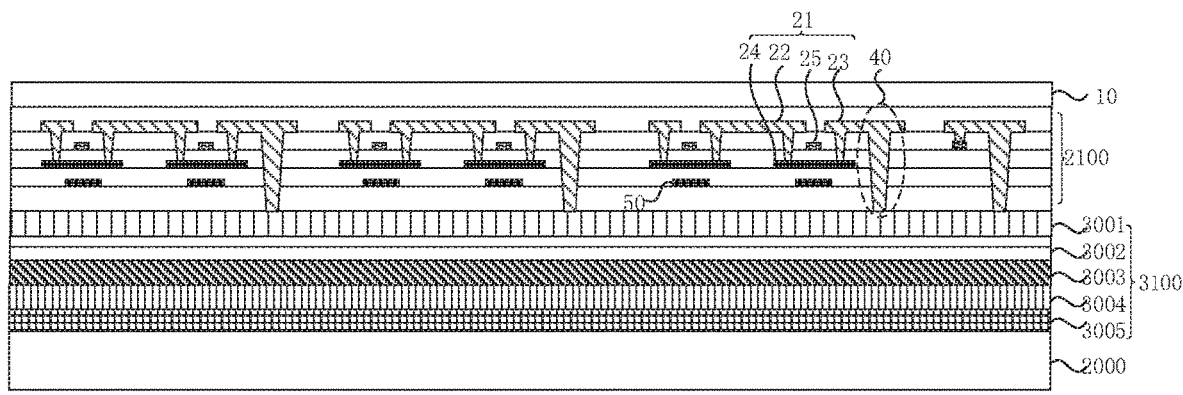
FIG. 13 is a structural diagram after a substrate is disposed according to an embodiment of the present disclosure.

FIG. 13 is a structural diagram after a substrate is formed according to an embodiment of the present disclosure. Referring to FIG. 13, the LED element layer 3100 and the driving circuit layer 2100 are both disposed on the substrate 10. Compared with the related art in which micro-LED elements are transferred on an array substrate through a mass transfer technology, this embodiment, transferring the micro-LED elements and reserving a certain region for the existence of a transfer error during the transfer are not needed, and thus greatly improving a resolution of the display panel.

In S140, the first carrier substrate is peeled off.

Figure 14:
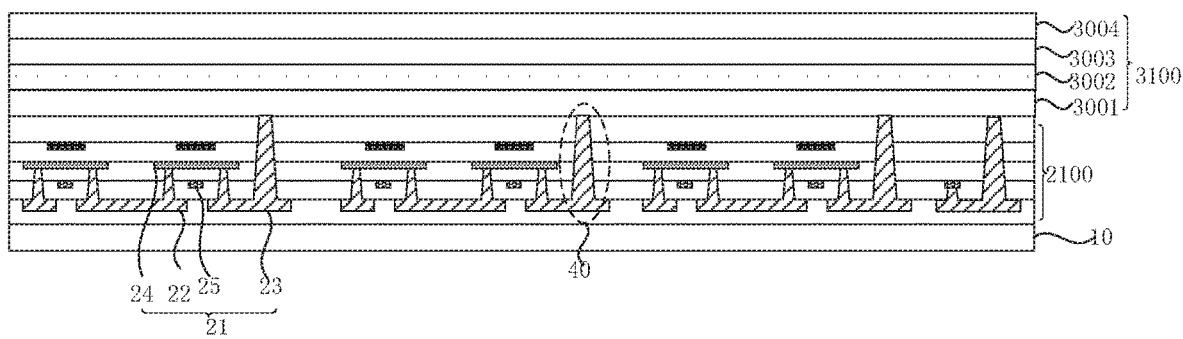
FIG. 14 is a structural diagram after a first carrier substrate is peeled off according to an embodiment of the present disclosure.

FIG. 14 is a structural diagram after a first carrier substrate is peeled off according to an embodiment of the present disclosure. Referring to FIG. 14, the first carrier substrate 2000 is peeled off and turned over.

Optionally, with continued reference to FIG. 14, in a case where the LED element layer 3100 includes the buffer layer 3005, after the first carrier substrate 2000 is peeled off, the buffer layer 3005 also needs to be peeled off. At this time, the LED element layer 3100 includes the first electrode layer 3001, the second-type semiconductor layer 3002, the light-emitting layer 3003 and the first-type semiconductor layer 3004.

In S150, the LED element layer is patterned to form a plurality of micro-LED elements, where each of the plurality of micro-LED elements is electrically connected to a respective one of the plurality of driving circuits through a via hole in the respective one of the plurality of driving circuits.

Figure 15:
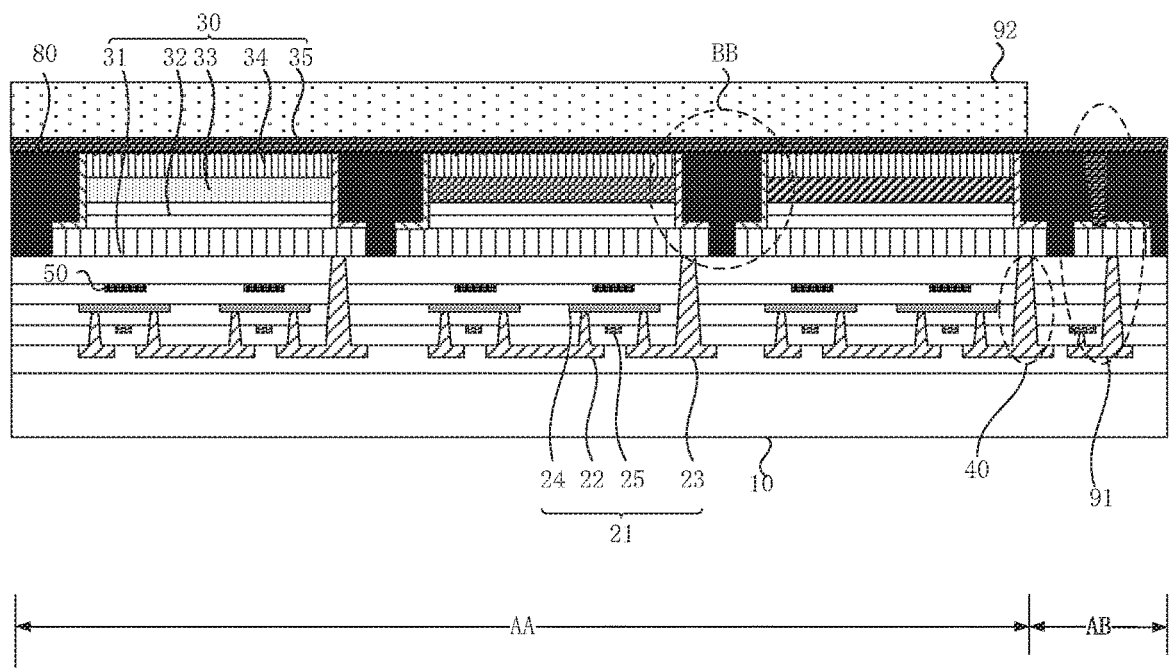
FIG. 15 is a structural diagram after a plurality of micro-LED elements are formed according to an embodiment of the present disclosure.

FIG. 15 is a structural diagram after a plurality of micro-LED elements is formed according to an embodiment of the present disclosure. Referring to FIG. 15, the LED element layer is patterned to form a first electrode 31, a second-type semiconductor 32, a light-emitting layer 33 and a first-type semiconductor 34. Optionally, an entire layer of a second electrode 35 is then prepared to form the plurality of micro-LED elements 30. The second electrode 35 does not need to be patterned, thereby simplifying the process steps.

In this embodiment, during the preparation of the driving circuit layer on the LED element layer, the driving circuits in the driving circuit layer have already been electrically connected to the LED element layer through the via holes; therefore, when sub-pixels are subsequently segmented to form the plurality of micro-LED elements, the micro-LED elements may be directly electrically connected to the driving circuits in a one-to-one correspondence through the via holes in the driving circuits, so that bonding technology is avoided. In addition, during the preparation of the display panel, the LED element layer and the driving circuit layer may be directly prepared on the sapphire substrate and then attached with the substrate; therefore, the sub-pixels are segmented without the problem of a mass transfer of the micro-LED elements, improving preparation efficiency of the display panel. In addition, the driving circuit layer is fabricated above the LED element layer, and then the LED element layer and the driving circuit layer are arranged on the substrate and the sub-pixels are segmented, that is, the LED element layer is disposed as an entire layer; therefore, the driving circuit layer is prepared with good flatness, avoiding a risk of disconnection between structures in the driving circuits in the driving circuit layer.

Figure 16:
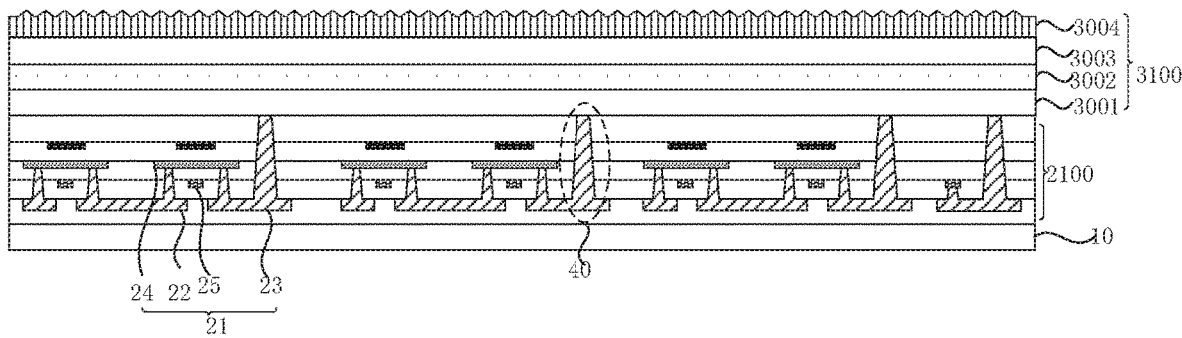
FIG. 16 is a structural diagram after a first-type semiconductor layer is formed with a rough and bumpy surface according to an embodiment of the present disclosure.

Optionally, FIG. 16 is a structural diagram after a first-type semiconductor layer is formed with a rough and bumpy surface according to an embodiment of the present disclosure. Referring to FIG. 16, before the LED element layer 3100 is patterned, the first-type semiconductor layer 3004 is roughened. Light-emitting efficiency of the prepared display panel can be improved, and the problem of total reflection of the light emitted by the micro-LED element can be avoided, which will affect the light yield.

Optionally, during the LED element layer is patterned to form the plurality of micro-LED elements, steps described below are included.

The first-type semiconductor layer, the light-emitting layer and the second-type semiconductor layer are etched to form a first-type semiconductor, a light-emitting layer and a second-type semiconductor of the each of the plurality of micro-LED elements.

The conductive layer is patterned to form a plurality of first electrodes; where a first sub-pixel gap is formed between adjacent first-type semiconductors, adjacent light-emitting layers, adjacent second-type semiconductors and adjacent first electrodes.

Figure 17:
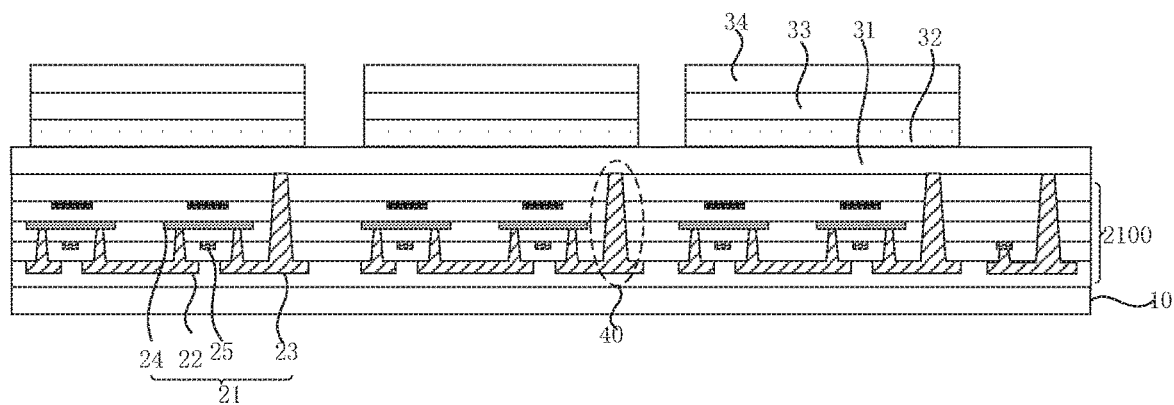
FIG. 17 is a structural diagram after an LED element layer is patterned according to an embodiment of the present disclosure.
Figure 18:
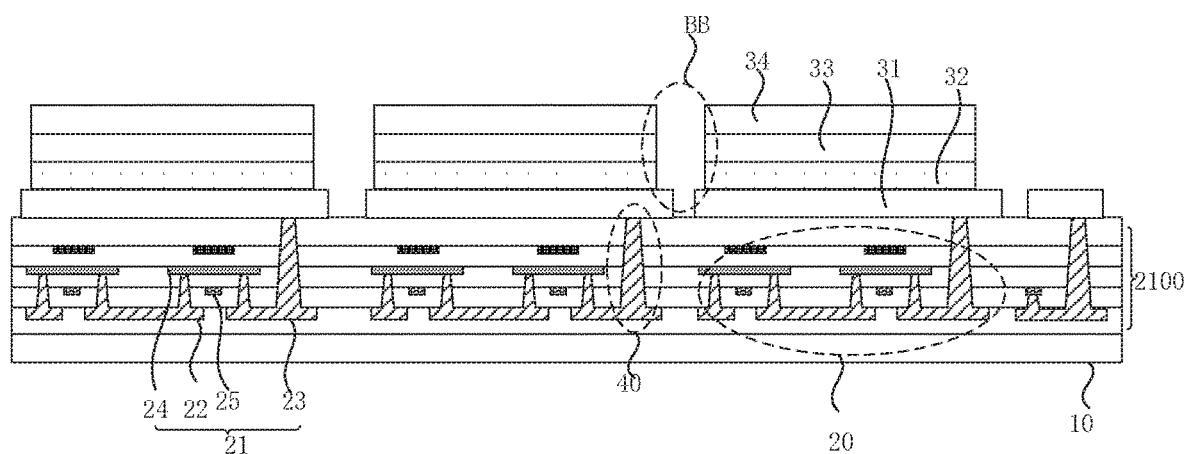
FIG. 18 is a structural diagram after first electrodes are formed according to an embodiment of the present disclosure.

FIG. 17 is a structural diagram after a first-type semiconductor layer, a light-emitting layer and a second-type semiconductor layer are etched according to an embodiment of the present disclosure. FIG. 18 is a structural diagram after first electrodes are formed according to an embodiment of the present disclosure. Referring to FIG. 17, for example, the first-type semiconductor layer, the light-emitting layer and the second-type semiconductor layer may be simultaneously etched through a dry etching process, or the first-type semiconductor layer, the light-emitting layer and the second-type semiconductor layer may be etched separately by the dry etching process, to form the second-type semiconductor 32, the light-emitting layer 33 and the first-type semiconductor 34 of the each of the plurality of micro-LED elements. The simultaneous etching of the first-type semiconductor layer, the light-emitting layer and the second-type semiconductor layer can simplify the process steps. Referring to FIG. 18, the conductive layer may be patterned by dry etching, wet etching, laser etching or other etching methods known to those skilled in the art, to form the first electrodes 31. Along a direction parallel to the substrate 10, a width of the first electrode 31 is greater than a width of the driving circuit 20. An advantage of such an arrangement is to protect the driving circuit 20 by the first electrode 31, thereby solving the problem that light emitted by the micro-LED element 30 corresponding to an adjacent driving circuit 20 is irradiated into this driving circuit 20, which results in instability of the driving circuit 20 and affects a display effect. A first sub-pixel gap BB is formed between adjacent first-type semiconductors 34, adjacent light-emitting layers 33, adjacent second-type semiconductors 32 and adjacent first electrodes 31.

Optionally, after the conductive layer is patterned to form the plurality of first electrodes, the preparation method further includes a step described below.

An insulating layer is formed on a sidewall of the first sub-pixel gap.

Figure 19:
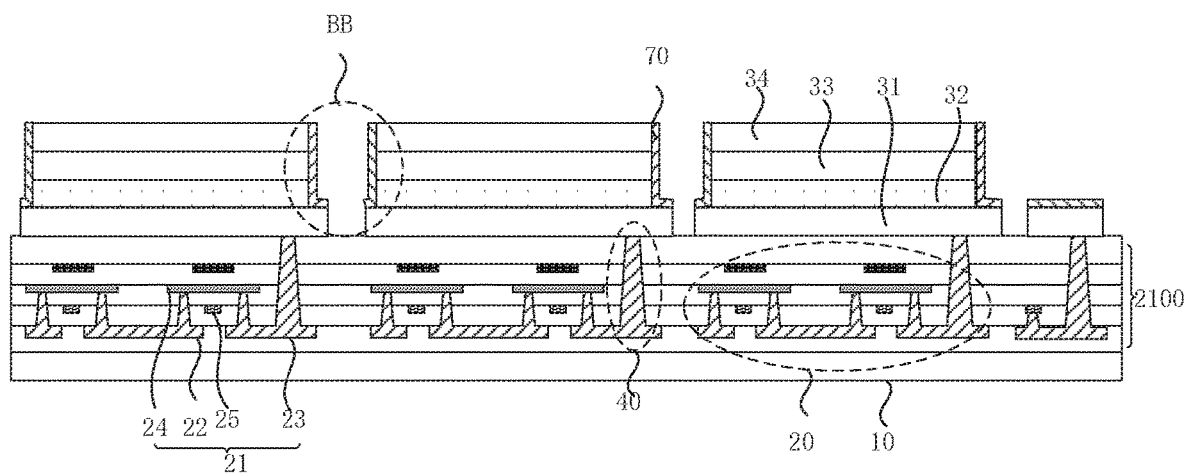
FIG. 19 is a structural diagram after an insulating layer is formed according to an embodiment of the present disclosure.

FIG. 19 is a structural diagram after an insulating layer is formed according to an embodiment of the present disclosure. Referring to FIG. 19, the insulating layer 70 is formed on the sidewall of the first sub-pixel gap BB, that is, the insulating layer 70 is formed on a sidewall of the second-type semiconductor 32, the light-emitting 33 and the first-type semiconductor layer 34. The insulating layer 70 is provided to prevent the second-type semiconductor 32 and the first-type semiconductor 34 from a current leakage through the sidewall where the current leakage affects the performance of the micro-LED element. A material of the insulating layer 70 is not specifically limited in this embodiment, as long as it can prevent the second-type semiconductor 32 and the first-type semiconductor 34 from the current leakage through the sidewall.

Optionally, after the conductive layer is patterned to form the plurality of first electrodes, the preparation method further includes a step described below.

A first wall structure is formed within the first sub-pixel gap.

Figure 20:
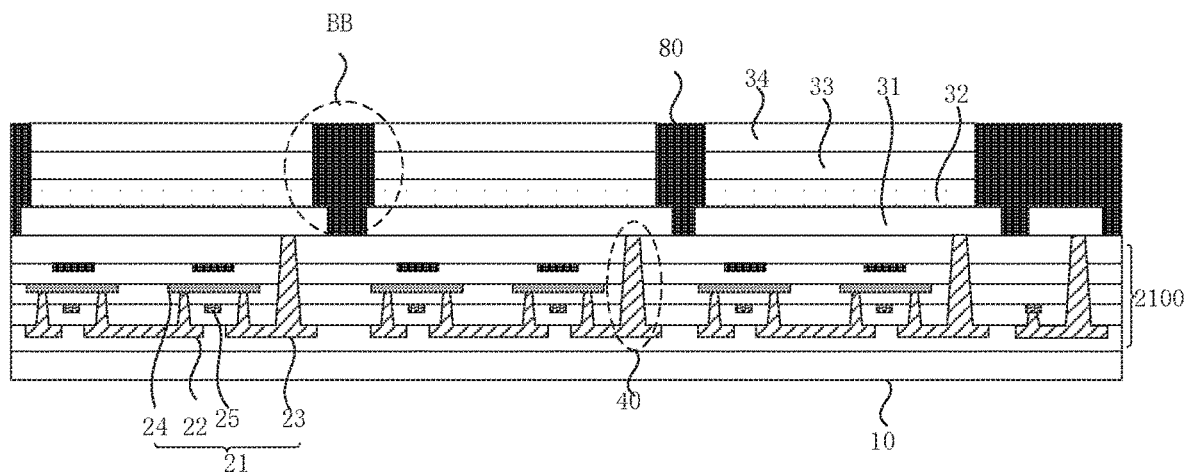
FIG. 20 is a structural diagram after a first wall structure is formed according to an embodiment of the present disclosure.

FIG. 20 is a structural diagram after a first wall structure is formed according to an embodiment of the present disclosure. Referring to FIG. 20, the first wall structure 80 is formed within the first sub-pixel gap BB. The first wall structure 80 is provided to prevent crosstalk between light emitted by adjacent micro-LED elements 30 after the display panel is formed, thereby improving the display effect of the display panel.

Optionally, after the first wall structure is formed within the first sub-pixel gap, the preparation method further includes: forming a second electrode on a surface of the first-type semiconductor facing away from the substrate. In this way, the micro-LED element 30 in FIG. 15 is formed. The second electrode 35 is disposed as an entire layer, which simplifies the process steps and improves the preparation efficiency of the display panel.

Optionally, before the first carrier substrate is peeled off, the preparation method further includes: attaching a second carrier substrate to a side of the substrate facing away from the driving circuit layer.

Figure 21:
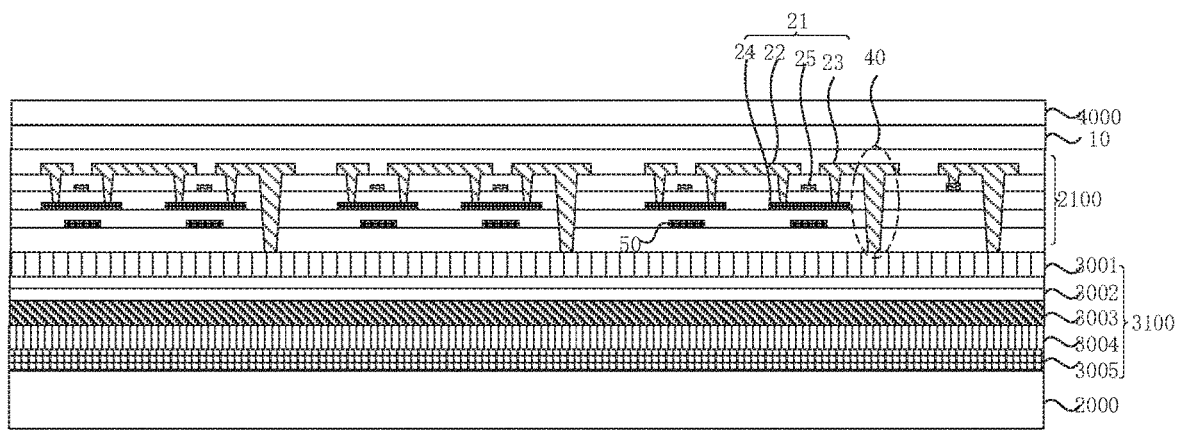
FIG. 21 is a structural diagram after a second carrier substrate is attached according to an embodiment of the present disclosure.

FIG. 21 is a structural diagram after a second carrier substrate is attached according to an embodiment of the present disclosure. As shown in FIG. 21, in a case where the substrate 10 is a flexible substrate, the second carrier substrate 4000 needs to be attached to a side of the substrate 10 facing away from the driving circuit layer 2100 after the substrate 10 is attached and before the first carrier substrate 2000 is peeled off. The second carrier substrate 4000 is used to support the substrate 10, the driving circuit layer 2100 and the LED element layer 3100 in subsequent preparation processes. After the plurality of micro-LED elements are formed, the second carrier substrate 4000 is peeled off. In a case where the substrate 10 is a rigid substrate, the second carrier substrate does not need to be attached. The rigid substrate can support the substrate 10, the driving circuit layer 2100 and the LED element layer 3100 in the subsequent preparation processes.

Optionally, before forming the driving circuit layer on the side of the LED element layer facing away from the first carrier substrate, the preparation method further includes: forming a light-shielding layer.

In particular, with continued reference to FIG. 12, before the driving circuit layer 2100 is formed, the light-shielding layer 50 is formed. Along a direction perpendicular to the substrate 10, a vertical projection of the light-shielding layer 50 on a plane where the substrate 10 is located covers a vertical projection of a channel region of the active layer 24 on the plane where the substrate 10 is located. The light-shielding layer 50 blocks light from the micro-LED element 30 to avoid an effect on a channel of the active layer 24, and thus the problem of photo-generated carriers generated by the channel of the active layer 24 affecting switching characteristics of the thin film transistor 21 is avoided, and the reliability of the thin film transistor 21 is improved.

It is understandable that since the light-shielding layer 50 is very thin and covered by the insulating layer, a thickness of the light-shielding layer 50 will not affect the performance of the active layer 24 and thus there are no affection on the performance of the thin film transistor 21.

Optionally, after the second electrodes are formed on the surfaces of the first-type semiconductors facing away from the substrate, the preparation method further includes: forming a color film layer on a side of the plurality of micro-LED elements facing away from the substrate; where the plurality of micro-LED elements emit the same color of light. During the preparation of the LED element layer, the light-emitting layer may be disposed as an entire layer, which can simplify the process steps. Therefore, after the micro-LED elements are formed, the plurality of micro-LED elements emit the same color of light. In this case, the color film layer is formed on the side of the plurality of micro-LED elements facing away from the substrate, therefore a color display of the display panel is achieved.

Based on the above solution, optionally, the step of forming the color film layer on a side of the plurality of micro-LED elements facing away from the substrate includes: forming a second wall structure at a position of the first wall structure; and forming a sub-color film structure between adjacent second wall structures.

Figure 22:
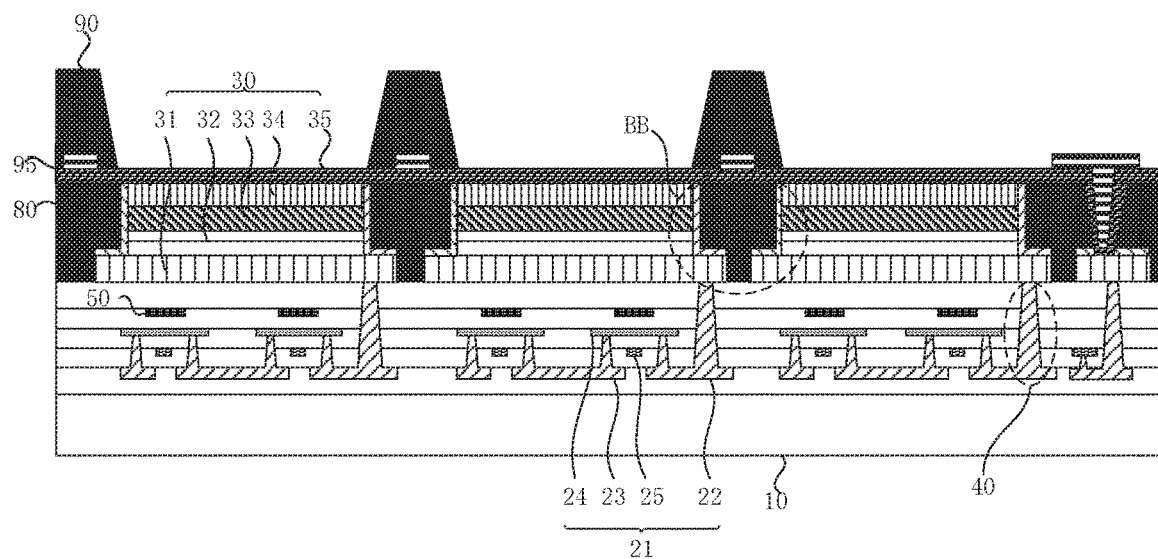
FIG. 22 is a structural diagram after a second wall structure is formed according to an embodiment of the present disclosure.
Figure 23:
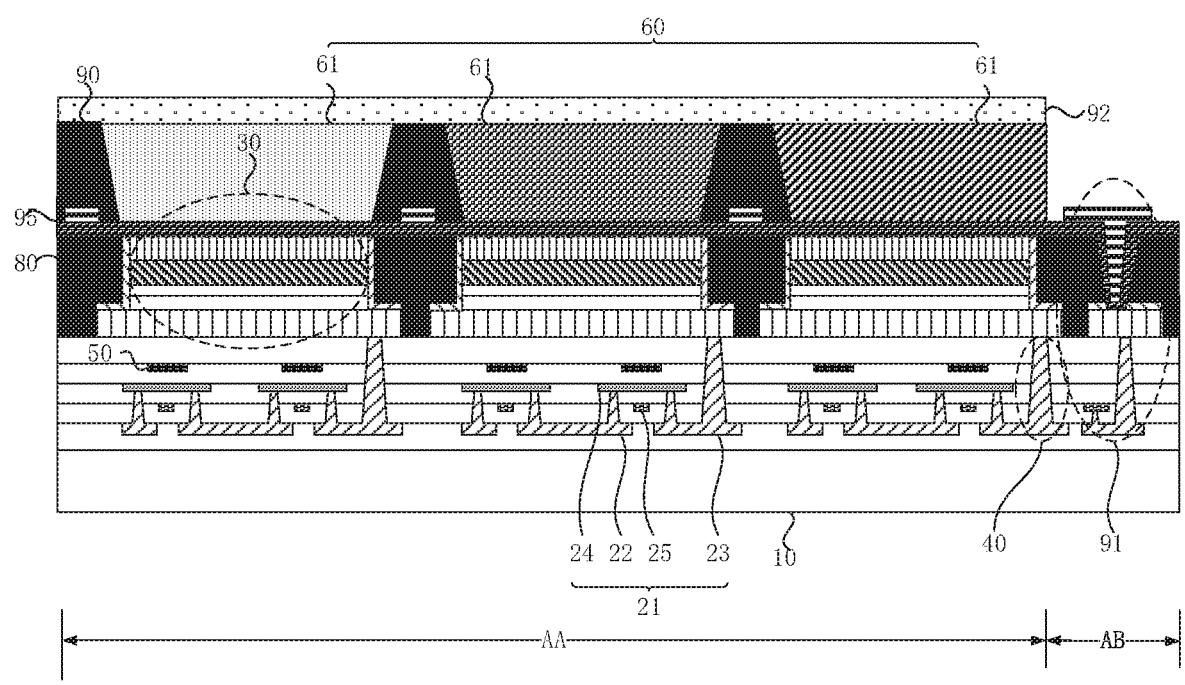
FIG. 23 is a structural diagram after sub-color film structures are formed according to an embodiment of the present disclosure.

FIG. 22 is a structural diagram after a second wall structure is formed according to an embodiment of the present disclosure. FIG. 23 is a structural diagram after sub-color film structures are formed according to an embodiment of the present disclosure. As shown in FIG. 22 and FIG. 23, the second wall structure 90 is formed on the side of the second electrodes 35 facing away from the substrate 10, where a vertical projection of the second wall structure 90 on the plane where the substrate 10 is located at least overlaps in part a vertical projection of the first wall structure 80 on the plane where the substrate 10 is located. The sub-color film structure 61 is formed between adjacent second wall structures 90. The second wall structure 90 is made of a light-shielding material. For example, the light-shielding material may include a black matrix. The light-shielding material is not specifically limited in this embodiment. In this embodiment, the second wall structure 90 is provided to prevent the crosstalk between light emitted by adjacent micro-LED elements 30 after the display panel is formed, thereby improving the display effect of the display panel. The color display of the display panel 100 is achieved through the sub-color film structure 61.

Figure 24:
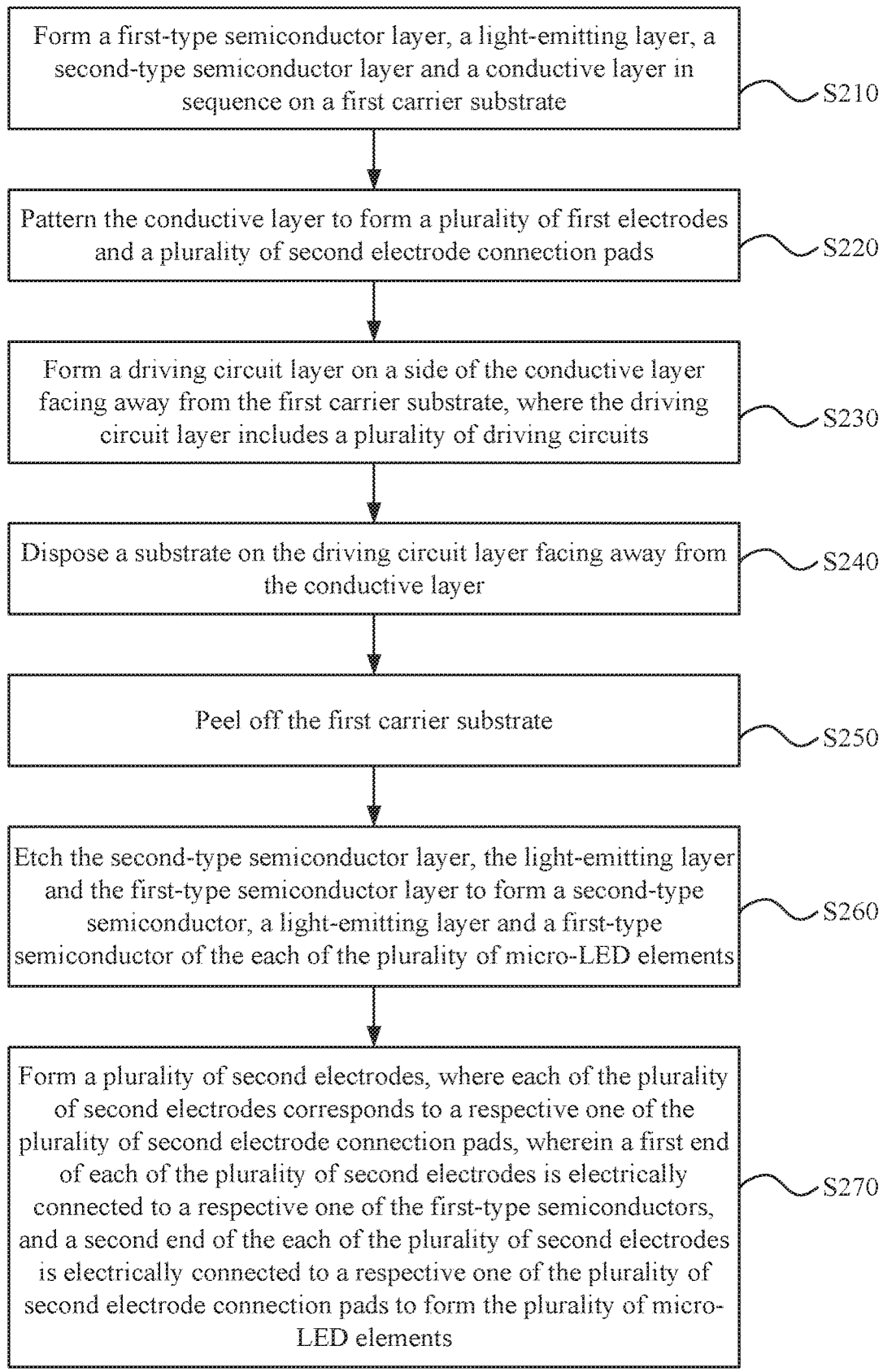
FIG. 24 is a flowchart of another preparation method for a display panel according to an embodiment of the present disclosure.

Optionally, FIG. 24 is a flowchart of another preparation method for a display panel according to an embodiment of the present disclosure. As shown in FIG. 24, the preparation method for a display panel specifically includes steps described below.

In S210, the first-type semiconductor layer, the light-emitting layer, the second-type semiconductor layer and the conductive layer are formed in sequence on the first carrier substrate; where the first-type semiconductor layer is the P-type semiconductor, and the second-type semiconductor layer is the N-type semiconductor; or the second-type semiconductor layer is the P-type semiconductor, and the first-type semiconductor layer is the N-type semiconductor.

Figure 25:
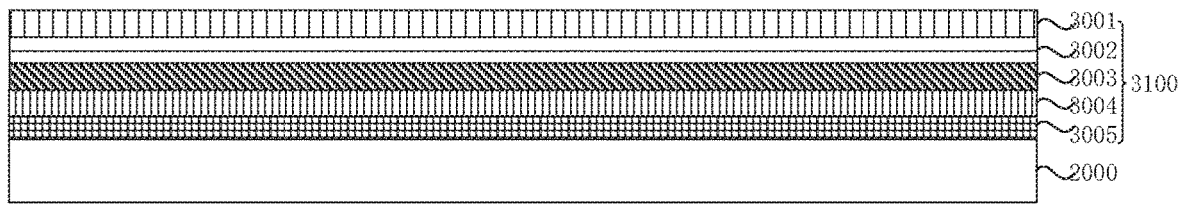
FIG. 25 is a structural diagram after a first-type semiconductor layer, a light-emitting layer, a second-type semiconductor layer and a conductive layer are formed according to an embodiment of the present disclosure.

FIG. 25 is a structural diagram after a first-type semiconductor layer, a light-emitting layer, a second-type semiconductor layer and a conductive layer are formed according to an embodiment of the present disclosure. Referring to FIG. 25, the LED element layer 3100 is formed on the first carrier substrate 2000, where the LED element layer 3100 includes the first-type semiconductor layer 3004, the light-emitting layer 3003, the second-type semiconductor layer 3002 and the conductive layer 3001.

In S220, the conductive layer is patterned to form a plurality of first electrodes and a plurality of second electrode connection pads.

Figure 26:
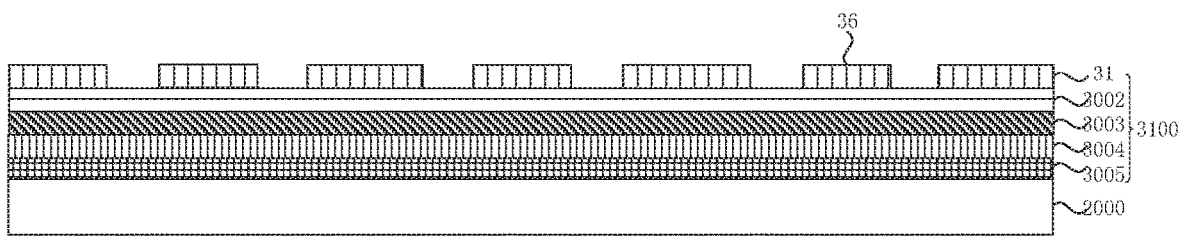
FIG. 26 is a structural diagram after first electrodes and second electrode connection pads are formed according to an embodiment of the present disclosure.

FIG. 26 is a structural diagram after first electrodes and second electrode connection pads are formed according to an embodiment of the present disclosure. Referring to FIG. 26, in a case where the micro-LED element includes a double-electrode micro-LED device, the first electrode and the second electrode of the double-electrode micro-LED element are disposed on a same side of the substrate. Therefore, in this embodiment, when the plurality of first electrodes 31 are formed, the plurality of second electrode connection pads 36 are formed at the same time, so that a cathode signal is provided for the second electrodes through the second electrode connection pads 36 after the second electrodes are formed.

In S230, the driving circuit layer is formed on a side of the conductive layer facing away from the first carrier substrate, where the driving circuit layer includes the plurality of driving circuits.

Figure 27:
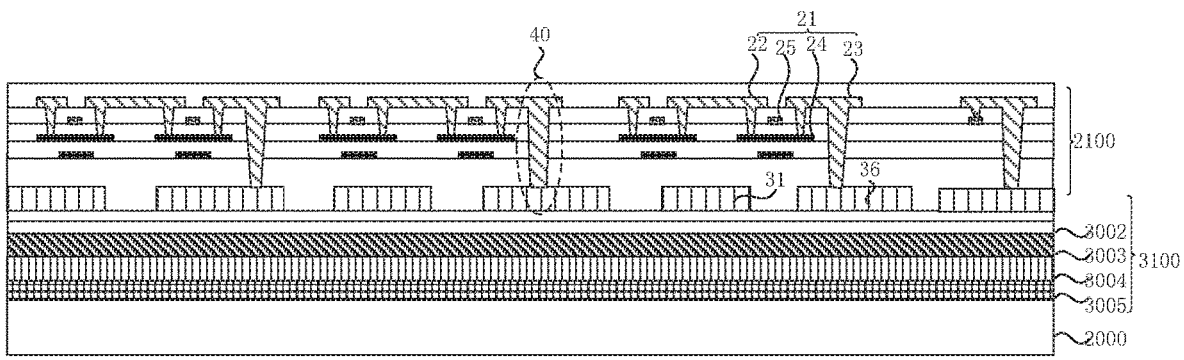
FIG. 27 is another structural diagram after a driving circuit layer is formed according to an embodiment of the present disclosure.

FIG. 27 is another structural diagram after a driving circuit layer is formed according to an embodiment of the present disclosure. Referring to FIG. 27, the driving circuit layer 2100 in this embodiment has a same structure as the driving circuit layer in the embodiment described above, and thus is not repeated in this embodiment.

In S240, a substrate is disposed on the driving circuit layer facing away from the conductive layer.

Figure 28:
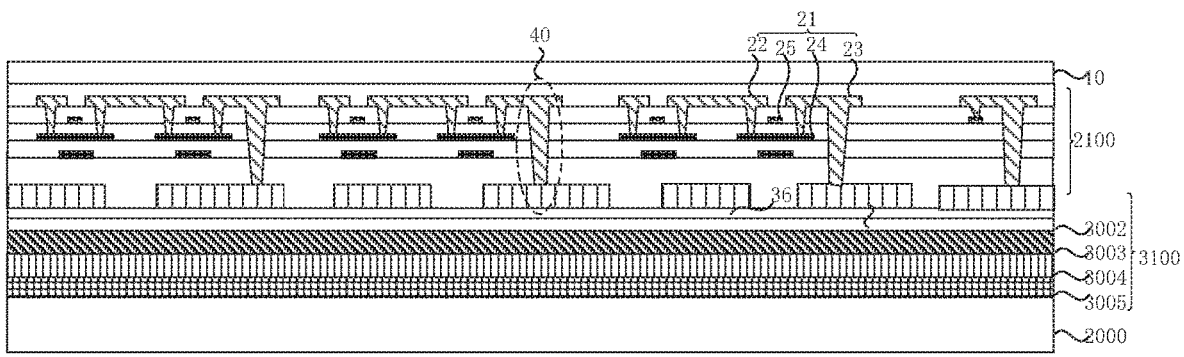
FIG. 28 is another structural diagram after a substrate is disposed according to an embodiment of the present disclosure.

FIG. 28 is another structural diagram after a substrate is disposed according to an embodiment of the present disclosure. Referring to FIG. 28, the LED element layer 3100 and the driving circuit layer 2100 are both disposed on the substrate 10. Compared with the related art in which double-electrode micro-LED elements are transferred on the array substrate through the mass transfer technology, in this embodiment, transferring the LED element layer and reserving a certain region for the existence of the transfer error during the transfer are not avoided, thereby greatly improving the resolution of the display panel.

In S250, the first carrier substrate is peeled off.

Figure 29:
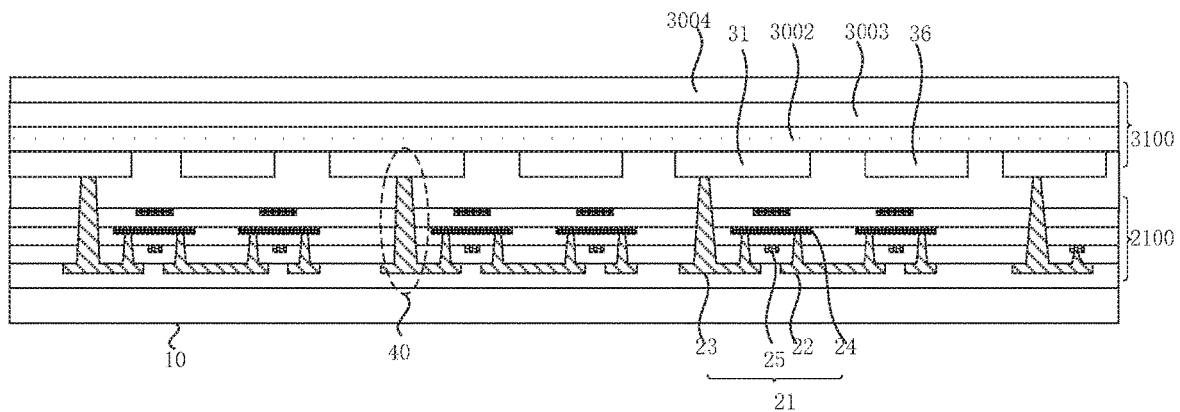
FIG. 29 is another structural diagram after a first carrier substrate is peeled off according to an embodiment of the present disclosure.

FIG. 29 is another structural diagram after a first carrier substrate is peeled off according to an embodiment of the present disclosure. Referring to FIG. 29, the first carrier substrate 2000 is peeled off and turned over.

In S260, the second-type semiconductor layer, the light-emitting layer and the first-type semiconductor layer are etched to form a second-type semiconductor, a light-emitting layer and a first-type semiconductor of the each of the plurality of micro-LED elements.

Figure 30:
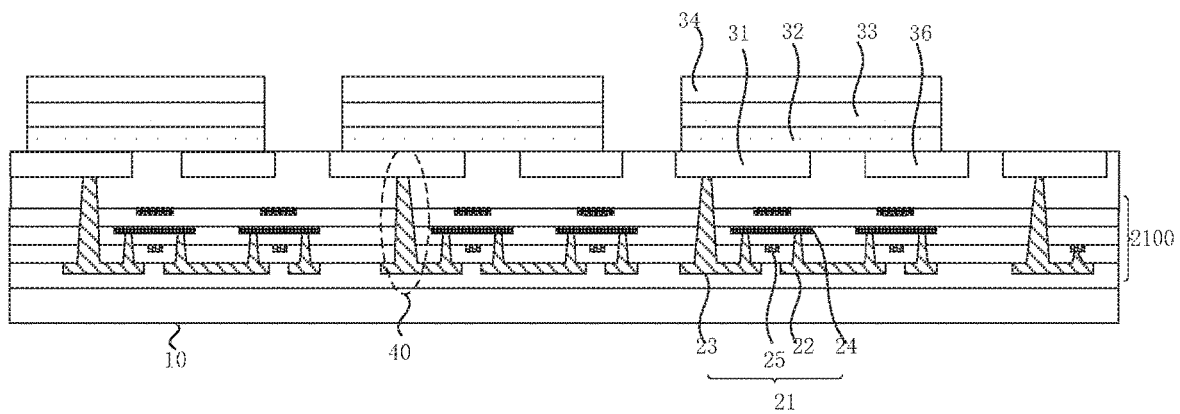
FIG. 30 is another structural diagram after an LED element layer is patterned according to an embodiment of the present disclosure.

FIG. 30 is another structural diagram after an LED element layer is patterned according to an embodiment of the present disclosure. As shown in FIG. 30, at this time, since the conductive layer has been patterned in step 220 to form the first electrodes 31 and the plurality of second electrode connection pads 36, merely the second-type semiconductor layer, the light-emitting layer and the first-type semiconductor layer are patterned at this time to form the second-type semiconductor 32, the light-emitting layer 33 and the first-type semiconductor 34 and the second electrode connection pads 36 are exposed. Optionally, the second-type semiconductor layer, the light-emitting layer and the first-type semiconductor layer may be simultaneously patterned or separately patterned, which is not specifically limited in this embodiment.

Figure 31:
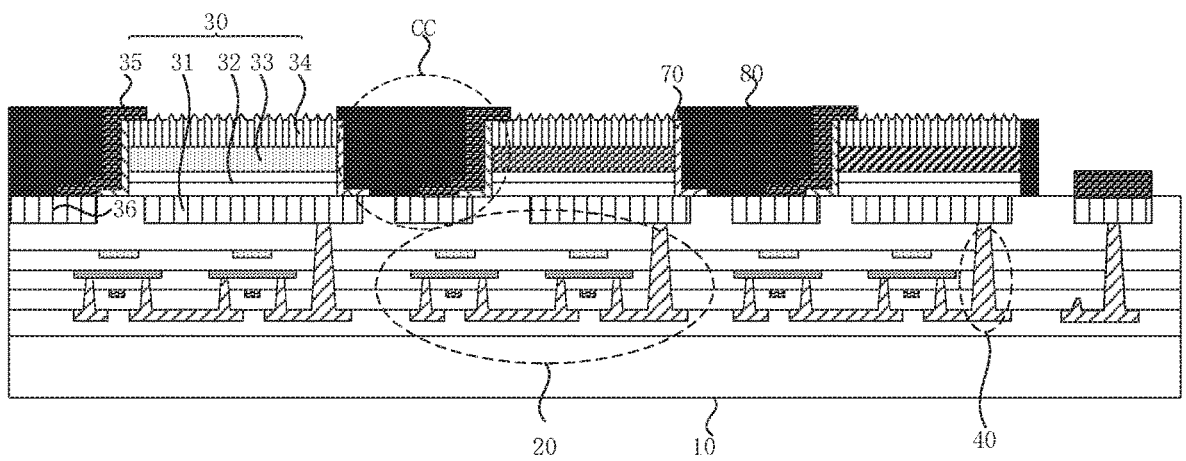
FIG. 31 is a structural diagram after second electrodes are formed according to an embodiment of the present disclosure.

In S270, a plurality of second electrodes are formed, where each of the plurality of second electrodes corresponds to a respective one of the plurality of second electrode connection pads, where a first end of each of the plurality of second electrodes is electrically connected to a respective one of the first-type semiconductors, and a second end of the each of the plurality of second electrodes is electrically connected to a respective one of the plurality of second electrode connection pads to form the plurality of micro-LED elements. Each of the plurality of micro-LED elements is electrically connected to a respective one of the plurality of driving circuits through a via hole in the respective one of the plurality of driving circuits. A second sub-pixel gap is formed between adjacent first-type semiconductors, adjacent light-emitting layers and adjacent second-type semiconductors FIG. 31 is a structural diagram after second electrodes are formed according to an embodiment of the present disclosure. As shown in FIG. 31, the second sub-pixel gap CC is formed between adjacent second-type semiconductors 32, adjacent light-emitting layers 33 and adjacent first-type semiconductors 34, where the second electrode 35 is disposed within the second sub-pixel gap CC. A first end of the second electrode 35 is electrically connected to the first-type semiconductor 34, and a second end of the second electrode 35 is electrically connected to a respective second electrode connection pad 36, therefore the plurality of micro-LED elements 30 are formed. Optionally, the second electrodes 35 of all the micro-LED elements 30 may be interconnected in a non-display region to receive the same cathode signal.

In this embodiment, when the driving circuit layer is prepared on the LED element layer, the driving circuits in the driving circuit layer have already been electrically connected to the LED element layer through the via holes; therefore, when the sub-pixels are subsequently segmented to form the plurality of double-electrode micro-LED elements, the double-electrode micro-LED elements may be directly electrically connected to the driving circuits in a one-to-one correspondence through the via holes in the driving circuits, so that no bonding technology is needed. In addition, during the preparation of the display panel, the LED element layer and the driving circuit layer may be directly prepared on the sapphire substrate and then attached with the substrate; therefore, the sub-pixels are segmented without the problem of the mass transfer of the micro-LED elements, improving the preparation efficiency of the display panel. In addition, the driving circuit layer is fabricated above the LED element layer, and then the LED element layer and the driving circuit layer are arranged on the substrate and the sub-pixels are segmented, that is, the LED element layer is disposed as an entire layer; therefore, the driving circuit layer is prepared with good flatness, avoiding the risk of disconnection between structures in the driving circuits in the driving circuit layer.

Optionally, with continued reference to FIG. 31, the insulating layer 70 is provided to prevent the second-type semiconductor 32 and the first-type semiconductor 34 from the current leakage through the sidewall.

On the basis of the above solution, optionally, after the plurality of second electrodes are formed, the preparation method further includes a step described below.

A first wall structure is formed within the second sub-pixel gap.

With continued reference to FIG. 31, the first wall structure 80 is formed within the second sub-pixel gap CC. The first wall structure 80 is provided to prevent the crosstalk between light emitted by adjacent micro-LED elements 30 after the display panel is formed, thereby improving the display effect of the display panel.

On the basis of the above solution, optionally, after the LED element layer is patterned to form the plurality of micro-LED elements, the preparation method further includes: forming the color film layer on the side of the plurality of micro-LED elements facing away from the substrate; where the plurality of micro-LED elements emit the same color of light.

Figure 32:
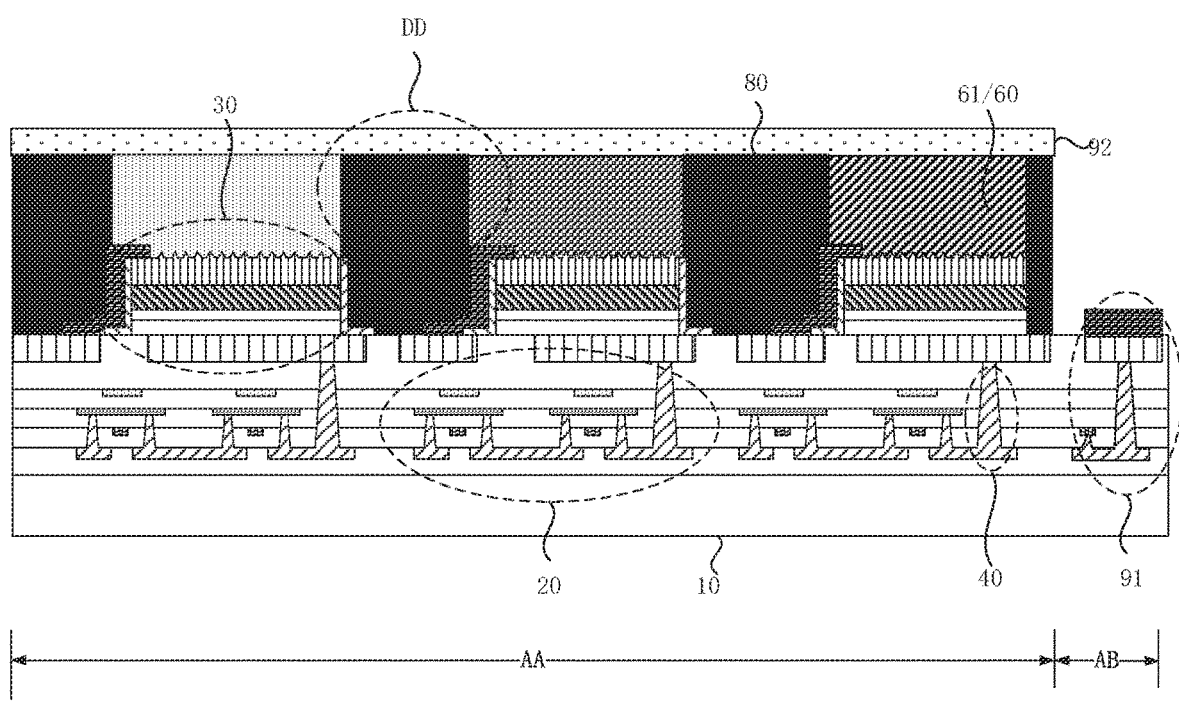
FIG. 32 is a structural diagram after a color film layer is formed according to an embodiment of the present disclosure.

FIG. 32 is a structural diagram after a color film layer is formed according to an embodiment of the present disclosure. As shown in FIG. 32, when the LED element layer is formed, the light-emitting layer is disposed as an entire layer, which can simplify the process steps; however, the plurality of micro-LED elements 30 subsequently formed emit the same color of light, and therefore, the color film layer 60 is disposed on the side of the plurality of micro-LED elements 30 facing away from the substrate 10 to achieve the color display of the display panel 100.

On the basis of the above solution, optionally, with continued reference to FIG. 32, the color film layer 60 includes a plurality of sub-color film structures 61; where a gap DD exists between adjacent sub-color film structures 61, and the first wall structure 80 extends into the gap DD. A type and a material of the sub-color film structure 61 in this embodiment are the same as those of the sub-color film structure 61 in the embodiment described above, and are not repeated in this embodiment.

Optionally, the display panel includes a display region and a non-display region surrounding the display region.

The method further includes a step described below.

A plurality of bonding terminals are formed in the non-display region of the display panel, where the plurality of bonding terminals are electrically connected to the LED element layer and the driving circuit layer.

The plurality of bonding terminals, the driving circuit layer and the LED element layer are all disposed on the same side of the substrate; or the plurality of bonding terminals are disposed on a side of the substrate facing away from the driving circuit layer.

Each of the bonding terminal includes multiple film structures, and the film structure of the bonding terminal may be prepared while film structures in the display panel are prepared. For example, referring to FIG. 15 and FIG. 32, structures in the bonding terminal 91 and structures in the display panel are arranged in same layers, thereby simplifying the process steps. The film structures of the bonding terminal 91 may also be separately prepared, which is not limited in this embodiment.

It is to be noted that FIG. 15 is an example which illustrates that the micro-LED element 30 is a single-electrode micro-LED element, and the bonding terminals 91, the driving circuit layer and the LED element layer are all disposed on the same side of the substrate 10. FIG. 32 is an example which illustrates that the micro-LED element 30 is the double-electrode micro-LED element and the bonding terminals 91, the driving circuit layer and the LED element layer are all disposed on the same side of the substrate 10.

Optionally, the method further includes a step described below.

A protective layer is disposed on the side of the micro-LED elements facing away from the substrate.

With continued reference to FIG. 15 and FIG. 32, the protective layer 92 is disposed on the side of the micro-LED elements 30 facing away from the substrate 10, and the display panel 100 is encapsulated and protected by the protective layer 92, where the bonding terminals 91 are exposed out of the protective layer 92.

It should be noted that the above description is merely preferred embodiments of the present disclosure and the technical principles used therein. It should be understood by those skilled in the art that the present disclosure is not limited to the specific embodiments described herein. Those skilled in the art may make various apparent modifications, adaptations and substitutions without departing from the scope of the present disclosure. Therefore, while the present disclosure has been described in detail through the above-mentioned embodiments, the present disclosure is not limited to the above-mentioned embodiments and may further include more other equivalent embodiments without departing from the concept of the present disclosure. The scope of the present disclosure is determined by the scope of the appended claims.

What is claimed is:

1. A display panel, comprising:
a substrate;
a driving circuit layer, wherein the driving circuit layer is disposed on a side of the substrate, and comprises a plurality of driving circuits; and
a light-emitting diode (LED) element layer, wherein the LED element layer is disposed on a side of the driving circuit layer facing away from the substrate, and comprises a plurality of micro-LED elements, wherein each of the plurality of micro-LED elements is electrically connected to a respective one of the plurality of driving circuits through a via hole;
wherein a thin film transistor of the plurality of driving circuits comprises a source electrode, a drain electrode, a gate electrode and an active layer;
the driving circuit further comprises a first film layer located between a film layer where the source electrode and the drain electrode are located and film layer where the gate electrode is located, a second film layer located between the film layer where the gate electrode is located and a film layer where the active layer is located and a third film layer between the film layer where the active layer is located and the LED element layer;
along a direction of the substrate pointing to the LED element layer, the film layer where the source electrode and the drain electrode are located, the first film layer, the film layer where the gate electrode is located, the second film layer, the film layer where the active layer is located and the third film layer are stacked in sequence;
the drain electrode is connected to the active layer through a first via hole penetrating the first film layer and the second film layer in sequence; and
the drain electrode is connected to a micro-LED element through the via hole penetrating the first film layer, the second film layer and the third film layer in sequence.

2. The display panel of claim 1, wherein the plurality of micro-LED elements emit a same color of light; and a color film layer is disposed on a side of the plurality of micro-LED elements facing away from the substrate.

3. The display panel of claim 2, wherein the color film layer comprises a plurality of sub-color film structures; wherein a second wall structure is disposed between adjacent sub-color film structures and disposed at a gap between adjacent micro-LED elements, and
wherein the second wall structure is made of a light-shielding material.

4. The display panel of claim 3, comprising a plurality of sub-pixel regions; wherein the each of the plurality of micro-LED elements corresponds to a respective one of the plurality of sub-pixel regions and emits blue light; each of the plurality of sub-pixel regions comprises a first sub-pixel region, a second sub-pixel region and a third sub-pixel region; and each of the plurality of sub-color film structures in the color film layer comprises a red sub-color film structure, a green sub-color film structure and a transparent sub-color film structure; wherein the red sub-color film structure is disposed in the first sub-pixel region, the green sub-color film structure is disposed in the second sub-pixel region, and the transparent sub-color film structure is disposed in the third sub-pixel region;
the red sub-color film structure is configured to convert a light beam emitted by a corresponding one of the plurality of micro-LED elements into a red light beam; and the green sub-color film structure is configured to convert a light beam emitted by a corresponding one of the plurality of micro-LED elements into a green light beam.

5. The display panel of claim 3, comprising a plurality of sub-pixel regions; wherein the each of the plurality of micro-LED elements corresponds to a respective one of the plurality of sub-pixel regions and emits white light; each of the plurality of sub-pixel regions comprises a first sub-pixel region, a second sub-pixel region and a third sub-pixel region; and each of the plurality of sub-color film structures in the color film layer comprises a red sub-color film structure, a green sub-color film structure and a blue sub-color film structure; wherein the red sub-color film structure is disposed in the first sub-pixel region, the green sub-color film structure is disposed in the second sub-pixel region, and the blue sub-color film structure is disposed in the third sub-pixel region; and the red sub-color film structure is configured to convert a light beam emitted by a corresponding one of the plurality of micro-LED elements into a red light beam, the green sub-color film structure is configured to convert a light beam emitted by a corresponding one of the plurality of micro-LED elements into a green light beam, and the blue sub-color film structure is configured to convert a light beam emitted by a corresponding one of the plurality of micro-LED elements into a blue light beam.

6. The display panel of claim 1, wherein the each of the plurality of micro-LED elements comprises a single-electrode micro-LED element; wherein along a direction away from the substrate, the single-electrode micro-LED element comprises a first electrode, a second-type semiconductor, a light-emitting layer, a first-type semiconductor and a second electrode which are arranged in sequence;
the first-type semiconductor is a P-type semiconductor, and the second-type semiconductor is a N-type semiconductor; or
the second-type semiconductor is the P-type semiconductor, and the first-type semiconductor is the N-type semiconductor.

7. The display panel of claim 6, wherein
a surface of the first-type semiconductor facing away from the substrate is a rough and bumpy surface;
a vertical projection of the respective one of the plurality of driving circuits on a plane where the substrate is located is located within a vertical projection of the first electrode on the plane where the substrate is located; and
an insulating layer is disposed on a sidewall of each of the plurality of micro-LED elements.

8. The display panel of claim 1, wherein the each of the plurality of micro-LED elements comprises a double-electrode micro-LED element; wherein the double-electrode micro-LED element comprises a first electrode, a second electrode, a second electrode connection pad, a second-type semiconductor, a light-emitting layer and a first-type semiconductor;
wherein the first electrode and the second electrode connection pad are disposed in a same layer; the second-type semiconductor is disposed between a layer where the first electrode is located and the light-emitting layer; the first-type semiconductor is disposed on a side of the light-emitting layer facing away from the substrate; and a first end of the second electrode is electrically connected to the first-type semiconductor, and a second end of the second electrode is electrically connected to the second electrode connection pad.

9. The display panel of claim 8, wherein
a surface of the first-type semiconductor facing away from the substrate is a rough and bumpy surface;
a vertical projection of the respective one of the plurality of driving circuits on a plane where the substrate is located is located within a vertical projection of the first electrode on the plane where the substrate is located; and
an insulating layer is disposed on a sidewall of each of the plurality of micro-LED elements.

10. The display panel of claim 1, wherein a first wall structure is disposed between adjacent micro-LED elements, wherein the first wall structure is made of a light-shielding material.

11. The display panel of claim 1, comprising a display region and a non-display region surrounding the display region;
wherein the non-display region of the display panel is provided with a plurality of bonding terminals which is electrically connected to the LED element layer and the driving circuit layer; and
wherein the plurality of bonding terminals, the driving circuit layer and the LED element layer are disposed on a same side of the substrate; or the plurality of bonding terminals are disposed on a side of the substrate facing away from the driving circuit layer.

12. A display device, comprising the display panel of claim 1.

13. A preparation method for a display panel, comprising:
forming a light-emitting diode (LED) element layer on a first carrier substrate;
forming a driving circuit layer on a side of the LED element layer facing away from the first carrier substrate, wherein the driving circuit layer comprises a plurality of driving circuits;
disposing a substrate on the driving circuit layer facing away from the LED element layer;
peeling off the first carrier substrate;
patterning the LED element layer to form a plurality of micro-LED elements, wherein each of the plurality of micro-LED elements is electrically connected to a respective one of the plurality of driving circuits through a via hole;
wherein forming the LED element layer on the first carrier substrate comprises:
forming a first-type semiconductor layer, a light-emitting layer, a second-type semiconductor layer and a conductive layer in sequence on the first carrier substrate;
wherein before patterning the LED element layer to form the plurality of micro-LED elements, the method further comprises roughening a surface of the first-type semiconductor layer facing away from the light-emitting layer to form a rough and bumpy surface; and
wherein patterning the LED element layer to form the plurality of micro-LED elements comprises:
patterning the LED element layer to form the plurality of micro-LED elements comprises:
etching the first-type semiconductor layer, the light-emitting layer and the second-type semiconductor layer to form a first-type semiconductor, a light-emitting layer and a second-type semiconductor of the each of the plurality of micro-LED elements; and
patterning the conductive layer to form a plurality of first electrodes;
wherein a first sub-pixel gap is formed between adjacent first-type semiconductors, adjacent light-emitting layers, adjacent second-type semiconductors and adjacent first electrodes.

14. The preparation method of claim 13, wherein
the first-type semiconductor layer is a P-type semiconductor, and the second-type semiconductor layer is a N-type semiconductor; or
the second-type semiconductor layer is the P-type semiconductor, and the first-type semiconductor layer is the N-type semiconductor.

15. The preparation method of claim 14, after patterning the conductive layer to form the plurality of first electrodes, the method further comprises:
forming a first wall structure within the first sub-pixel gap;
after forming the first wall structure within the first sub-pixel gap, the method further comprises forming a second electrode on a surface of the first-type semiconductor facing away from the substrate; and
after forming the second electrode on the surface of the first-type semiconductor facing away from the substrate, the method further comprises: forming a color film layer on a side of the plurality of micro-LED elements facing away from the substrate, wherein the plurality of micro-LED elements emit a same color of light;
wherein forming the color film layer on the side of the plurality of micro-LED elements facing away from the substrate comprises:
forming a second wall structure at a position of the first wall structure; and
forming a sub-color film structure between adjacent second wall structures.

16. The preparation method of claim 14, after forming the first-type semiconductor layer, the light-emitting layer, the second-type semiconductor layer and the conductive layer in sequence on the first carrier substrate, the method further comprises: patterning the conductive layer to form a plurality of first electrodes and a plurality of second electrode connection pads;
wherein patterning the LED element layer comprises:
etching the second-type semiconductor layer, the light-emitting layer and the first-type semiconductor layer to form a second-type semiconductor, a light-emitting layer and a first-type semiconductor of the each of the plurality of micro-LED elements; and
wherein after patterning the LED element layer, the preparation method further comprises:
forming a plurality of second electrodes, wherein each of the plurality of second electrodes corresponds to a respective one of the plurality of second electrode connection pads, wherein a first end of each of the plurality of second electrodes is electrically connected to a respective one of the first-type semiconductors, and a second end of the each of the plurality of second electrodes is electrically connected to a respective one of the plurality of second electrode connection pads to form the plurality of micro-LED elements;
wherein a second sub-pixel gap is formed between adjacent first-type semiconductors, adjacent light-emitting layers and adjacent second-type semiconductors, and
after forming the plurality of second electrodes, the method further comprises:
forming a first wall structure within the second sub-pixel gap.

17. The preparation method of claim 16, after patterning the LED element layer to form the plurality of micro-LED elements, the method further comprises:
- forming a color film layer on a side of the plurality of micro-LED elements facing away from the substrate;
- wherein the plurality of micro-LED elements emit a same color of light, the color film layer comprises a plurality of sub-color film structures, a gap exists between adjacent sub-color filter structures, and the first wall structure extends into the gap.

18. The preparation method of claim 14, after patterning the conductive layer to form the plurality of first electrodes, the method further comprises:
- forming an insulating layer on a sidewall of the first sub-pixel gap.

19. The preparation method of claim 13, wherein the display panel comprises a display region and a non-display region surrounding the display region; and
the method further comprises:
- forming a plurality of bonding terminals in the non-display region of the display panel, wherein the plurality of bonding terminals are electrically connected to the LED element layer and the driving circuit layer;
- wherein the plurality of bonding terminals, the driving circuit layer and the LED element layer are all disposed on a same side of the substrate; or the plurality of bonding terminals are disposed on a side of the substrate facing away from the driving circuit layer.

20. A preparation method for a display panel, comprising:
forming a light-emitting diode (LED) element layer on a first carrier substrate;
- forming a driving circuit layer on a side of the LED element layer facing away from the first carrier substrate, wherein the driving circuit layer comprises a plurality of driving circuits;
- disposing a substrate on the driving circuit layer facing away from the LED element layer;
- peeling off the first carrier substrate;
- patterning the LED element layer to form a plurality of micro-LED elements,
wherein each of the plurality of micro-LED elements is electrically connected to a respective one of the plurality of driving circuits through a via hole; and
- before peeling off the first carrier substrate, attaching a second carrier substrate to a side of the substrate facing away from the driving circuit layer.

* * * * *